United States Patent
Kim et al.

(10) Patent No.: US 11,824,064 B2
(45) Date of Patent: Nov. 21, 2023

(54) DISPLAY DEVICE, METHOD OF MANUFACTURING THE SAME, AND TILED DISPLAY DEVICE INCLUDING THE SAME

(71) Applicant: Samsung Display Co., Ltd., Yongin-si (KR)

(72) Inventors: Tae Gyun Kim, Hwaseong-si (KR); Jun Hong Park, Suwon-si (KR); Eui Suk Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 166 days.

(21) Appl. No.: 17/448,855

(22) Filed: Sep. 24, 2021

(65) Prior Publication Data

US 2022/0165757 A1    May 26, 2022

(30) Foreign Application Priority Data

Nov. 26, 2020    (KR) .................. 10-2020-0161257

(51) Int. Cl.
*H01L 27/12*    (2006.01)
*H01R 12/62*    (2011.01)

(52) U.S. Cl.
CPC ........ *H01L 27/124* (2013.01); *H01L 27/1259* (2013.01); *H01R 12/62* (2013.01)

(58) Field of Classification Search
CPC ..................................................... H01L 27/12
See application file for complete search history.

(56) References Cited

U.S. PATENT DOCUMENTS

| | | | | |
|---|---|---|---|---|
| 2018/0314369 | A1* | 11/2018 | Yashiro | ............... H01Q 1/243 |
| 2020/0211920 | A1* | 7/2020 | Lee | .................. H01L 23/5385 |
| 2020/0393936 | A1* | 12/2020 | Bok | ..................... H10K 59/40 |
| 2021/0151542 | A1* | 5/2021 | Choe | ................. H10K 59/1216 |

FOREIGN PATENT DOCUMENTS

| | | |
|---|---|---|
| KR | 96-0702710 A | 4/1996 |
| KR | 10-2017-0039030 A | 4/2017 |
| KR | 10-2019-0048642 A | 5/2019 |

* cited by examiner

*Primary Examiner* — Sang V Nguyen
(74) *Attorney, Agent, or Firm* — Lewis Roca Rothgerber Christie LLP

(57) ABSTRACT

A display device includes: a first substrate; a second substrate on the first substrate and exposing a first edge portion of the first substrate, the second substrate protruding beyond a second edge portion of the first substrate; a connection line on the first edge portion of the first substrate, the connection line having a first end portion protruding beyond a first side of the second substrate and a second end portion covered by the second substrate; and a thin-film transistor layer on the second substrate and connected to the connection line. The thin-film transistor layer includes signal lines extending from the first side to a second side of the second substrate. The signal lines extend into contact openings in the thin-film transistor layer and are exposed at a lower part of the second substrate on the second side of the second substrate.

4 Claims, 13 Drawing Sheets

DISPLAY DEVICE, METHOD OF MANUFACTURING THE SAME, AND TILED DISPLAY DEVICE INCLUDING THE SAME

CROSS-REFERENCE TO RELATED APPLICATION

This application claims priority to and the benefit of Korean Patent Application No. 10-2020-0161257, filed on Nov. 26, 2020 in the Korean Intellectual Property Office, the disclosure of which is incorporated herein by reference in its entirety.

BACKGROUND

1. Field

Aspects of embodiments of the present disclosure relate to a display device, a method of manufacturing the display device, and a tiled display device including the display device.

2. Description of Related Art

As the information society has developed, the demand for display devices for displaying images has diversified and increased. For example, display devices have been applied to various electronic devices, such as smart phones, digital cameras, notebook computers, navigation systems, and smart televisions. Examples of display devices include flat panel display devices, such as a liquid crystal display (LCD) device, a field emission display (FED) device, or an organic light-emitting diode (OLED) display device. A light-emitting display device, which is a type of flat panel display device, includes light-emitting elements capable of emitting light and, thus, can display an image without a backlight unit providing light to the display panel.

When a large-size display device is fabricated, the defect rate of light-emitting elements may increase due to an increase in the number of pixels, and the productivity or reliability of the display device may decrease. To address these problems, a tiled display device having a large screen may be implemented by connecting multiple display devices, each having a relatively small size, together. The tiled display device may have seams (e.g., boundary portions) between the display devices due to the presence of non-display areas (e.g., bezels) in the display devices. When an image is being displayed on the entire screen of the tiled display device, the seams cause a sense of discontinuity, adversely affecting the sense of immersion of the image.

SUMMARY

Embodiments of the present disclosure provide a tiled display device that reduce or eliminate the sense of discontinuity between multiple display devices and enhance the sense of immersion of an image by reducing or eliminating the visibility of boundary portions or non-display areas between the display devices.

Embodiments of the present disclosure also provide a tiled display device in which connection lines of a second display device extend to and below the display area of a first display device and connect gate lines or data lines of the first display device and gate lines or data lines, respectively, of the second display device to each other so that bonding areas between adjacent display devices may not include flexible films, gate drivers, and data drivers.

However, aspects and features of the present disclosure are not restricted to those set forth herein. The above and other aspects and features of embodiments of the present disclosure will become more apparent to one of ordinary skill in the art to which the present disclosure pertains by referencing the detailed description of the present disclosure given below.

According to an embodiment of the present disclosure, a display device includes: a first substrate; a second substrate on the first substrate and exposing a first edge portion of the first substrate, the second substrate protruding beyond a second edge portion of the first substrate; a connection line on the first edge portion of the first substrate, the connection line having a first end portion protruding beyond a first side of the second substrate and a second end portion covered by the second substrate; and a thin-film transistor layer on the second substrate and connected to the connection line. The thin-film transistor layer includes signal lines extending from the first side to a second side of the second substrate. The signal lines extend into contact openings in the thin-film transistor layer and are exposed at a lower part of the second substrate on the second side of the second substrate.

The signal lines may include a gate line configured to provide a gate signal to the thin-film transistor layer. A first end portion of the gate line may be in a first contact opening, and the first contact opening may penetrate the thin-film transistor layer and the second substrate on the first side of the second substrate to be connected to the connection line. A second end portion of the gate line may be in a second contact opening, and the second contact opening may penetrate the thin-film transistor layer and the second substrate on the second side of the second substrate to be exposed at the lower part of the second substrate on the second side of the second substrate.

The signal lines may include a data line configured to provide a data voltage to the thin-film transistor layer. A first end portion of the data line may be in a third contact opening, and the third contact opening may penetrate the thin-film transistor layer and the second substrate on the first side of the second substrate to be connected to the connection line. A second end portion of the data line may be in a fourth contact opening, and the fourth contact opening may penetrate the thin-film transistor layer and the second substrate on the second side of the second substrate to be exposed at the lower part of the second substrate on the second side of the second substrate.

The display device may further include: a connection film on an end portion of the connection line; and a flexible film on the connection film.

According to an embodiment of the present disclosure, a tiled display device includes: a first display device having a first display area and including pixels in the first display area; a second display device having a second display area adjacent to the first display area and including pixels in the second display area; and a bonding area between the first and second display areas. Each of the first and second display devices includes: a first substrate; connection lines on an edge portion of the first substrate; a second substrate on the connection lines and the first substrate; and a thin-film transistor layer on the second substrate. The edge portion of the first substrate of the second display device and first end portions of the connection lines of the second display device overlap the second substrate of the first display device in a thickness direction.

The thin-film transistor layer of each of the first and second display devices may include gate lines configured to provide gate signals to the pixels. The gate lines of the first display device may be in first contact openings, and the first contact openings may penetrate the thin-film transistor layer and the second substrate of the first display device. The connection lines of the second display device may include first connection lines electrically connected to the gate lines of the first display device.

The first contact openings in the first display device may overlap first end portions of the first connection lines of the second display device in the thickness direction.

The tiled display device may further include connection films between the gate lines of the first display device and the first connection lines of the second display device to electrically connect the gate lines of the first display device and the first connection lines of the second display device.

The gate lines of the second display device may be in first contact openings, and the first contact openings may penetrate the thin-film transistor layer and the second substrate of the second display device, to be connected to second end portions of the first connection lines of the second display device.

The thin-film transistor layer of each of the first and second display devices may include data lines configured to provide data voltages to the pixels, and the data lines of the first display device may be in second contact openings. The second contact openings may penetrate the thin-film transistor layer and the second substrate of the first display device, and the connection lines of the second display device may include second connection lines electrically connected to the data lines of the first display device.

The second contact openings in the first display device may overlap first end portions of the second connection lines of the second display device in the thickness direction.

The tiled display device may further include connection films between the data lines of the first display device and the second connection lines of the second display device to electrically connect the data lines of the first display device and the second connection lines of the second display device.

The data lines of the second display device may be in second contact openings, and the second contact openings may penetrate the thin-film transistor layer and the second substrate of the second display device, to be connected to second end portions of the second connection lines of the second display device.

A first end portion of the first substrate of the first display device may protrude beyond a first end portion of the second substrate of the first display device in a first direction, and a second end portion of the first substrate of the first display device may be recessed from a second end portion of the second substrate of the first display device in the first direction.

The connection lines of the first display device may include first pad connection lines on the first end portion of the first substrate of the first display device, and the first display device may further include: first flexible films on the first pad connection lines; and gate drivers on the first flexible films and configured to provide gate signals to the first pad connection lines.

The thin-film transistor layer of the first display device may include gate lines configured to provide gate signals to the pixels. The gate lines of the first display device may be in third contact openings, and the third contact openings may penetrate the thin-film transistor layer and the second substrate of the first display device. First end portions of the first pad connection lines may be connected to the first flexible films, and second end portions of the first pad connection lines may be connected to the gate lines.

The connection lines of the first display device may include second pad connection lines on the first end portion of the first substrate of the first display device, and the first display device may further include: second flexible films on the second pad connection lines; and source drivers on the second flexible films and configured to provide data voltages to the second pad connection lines.

The thin-film transistor layer of the first display device may include data lines configured to provide data voltages to the pixels. The data lines of the first display device may be in fourth contact openings, and the fourth contact openings may penetrate the thin-film transistor layer and the second substrate of the first display device. First end portions of the second pad connection lines may be connected to the second flexible films, and second end portions of the second pad connection lines may be connected to the data lines.

A thickness of a first end portion of the second substrate of the first display device, which is supported by the first substrate of the first display device, may be greater than a thickness of a second end portion of the second substrate of the first display device, which overlaps the first substrate of the second display device in the thickness direction.

According to an embodiment of the present disclosure, a method of manufacturing a display device is provided. The method includes: arranging a connection line on a first edge portion of a first substrate; arranging a second substrate on the first substrate to expose a first end portion of the connection line; stacking a thin-film transistor layer on the second substrate, forming a first contact opening in first sides of the thin-film transistor layer and the second substrate to expose the connection line, and forming a second contact opening in second sides of the thin-film transistor layer and the second substrate; forming signal lines in the thin-film transistor layer, the signal lines extending into the first and second contact openings; removing a second edge portion of the first substrate; and removing a lower part of the second substrate on the second side of the second substrate to expose the signal lines in the second contact opening.

According to the aforementioned and other embodiments of the present disclosure, because connection lines of a second display device extend into the display area of a first display device and are arranged (or placed) below the second substrate of the first display device, the distance between the first and second display devices can be reduced or minimized. Because a tiled display device includes connection lines that connect groups of gate lines (or data lines) of each pair of adjacent display devices, no flexible films, gate drivers, or data drivers are provided in a bonding area between each pair of adjacent display devices. Thus, the bonding area of the tiled display device may not be visible or readily visible to a user, such that a sense of discontinuity between each pair of adjacent display devices may be reduced or eliminated and the degree of immersion of a displayed image may be improved.

Other aspects, features, and embodiments may be apparent from the following detailed description, the drawings, and the claims.

BRIEF DESCRIPTION OF THE DRAWINGS

The above and other aspects, features, and embodiments of the present disclosure will become more apparent by describing, in detail, embodiments thereof with reference to the attached drawings, in which.

DETAILED DESCRIPTION

Figure 1:
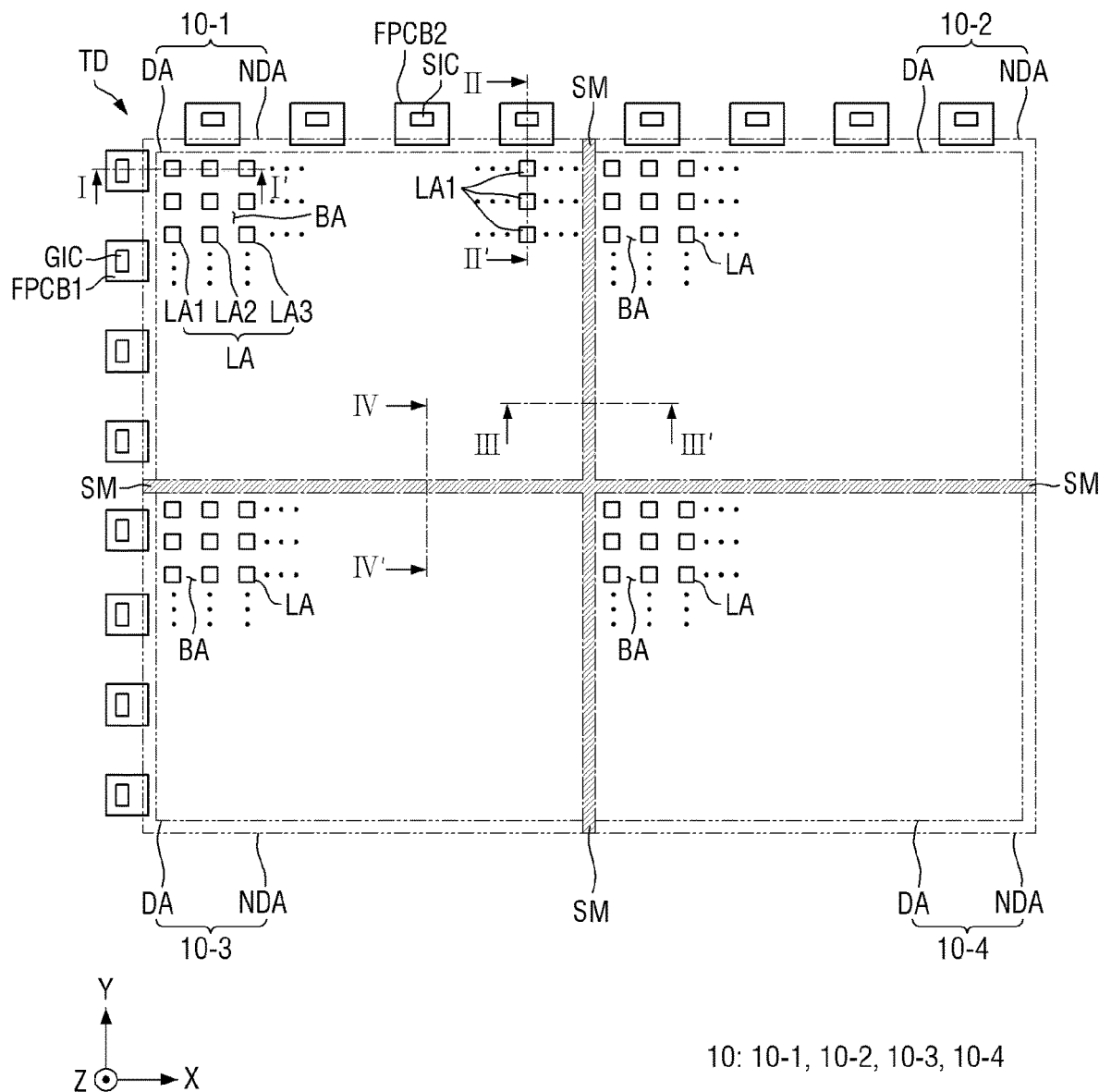
FIG. 1 is a plan view of a tiled display device according to an embodiment of the present disclosure.

In the following description, for the purpose of explanation, numerous details are set forth in order to provide a thorough understanding of various embodiments or implementations of the present disclosure. As used herein "embodiments" and "implementations" are interchangeable words that are non-limiting examples of devices or methods employing one or more of the concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different but do not have to be exclusive. For example, specific shapes, configurations, and characteristics of an embodiment may be used or implemented in other embodiments without departing from the present disclosure.

Unless otherwise specified, the illustrated embodiments are to be understood as providing features of varying detail of some ways in which the concepts may be implemented in practice. Therefore, unless otherwise specified, the features, components, modules, layers, films, panels, regions, and/or aspects, etc. (hereinafter individually or collectively referred to as "elements") of the various embodiments may be otherwise combined, separated, interchanged, and/or rearranged without departing from the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc. of the elements unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time (e.g., concurrently) or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to other element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device according to an embodiment of the present disclosure.

Referring to FIG. 1, a tiled display device TD may include a plurality of display devices 10. The display devices 10 may be arranged in a lattice pattern, but the present disclosure is not limited thereto. The display devices 10 may be connected in a first direction (e.g., an X-axis direction) and/or a second direction (e.g., a Y-axis direction) to provide the tiled display device TD with a particular shape. In one example, the display devices 10 may all have the same size as each other, but the present disclosure is not limited thereto. In another example, the display devices 10 may have different sizes from each other.

The display devices 10 may have a rectangular shape with a pair of long sides and a pair of short sides. The display devices 10 may be arranged by connecting the long sides or the short sides of adjacent ones of the display devices 10 to each other. Some of the display devices 10 may be arranged along the edges of the tiled display device TD to form the sides of the tiled display device TD. Some of the display devices 10 may be arranged at the corners of the tiled display device TD to form each pair of adjacent sides of the tiled display device TD. Some of the display devices 10 may be disposed in the middle of the tiled display device TD and may be surrounded by (e.g., surrounded along their peripheries by) other display devices 10.

Each of the display devices 10 may include a display area DA and a non-display area NDA. The display area DA may include a plurality of pixels and may be configured to display an image. The non-display area NDA may be disposed around the display area DA to surround the display area DA (e.g., to surround or extend around a periphery of the display area DA) and may not display an image.

The tiled display device TD may generally have a flat shape, but the present disclosure is not limited thereto. The tiled display device TD may have a stereoscopic shape to provide a sense of depth to a user. In one example in which the tiled display device TD has a stereoscopic shape, at least some of the display devices 10 may have a curved shape. In another example, the display devices 10 may all have a flat shape and may be connected to one another at an angle (e.g., at a predetermined angle) so that the tiled display device TD may have a stereoscopic shape.

The tiled display device TD may include bonding areas SM, which are disposed between a plurality of display areas DA. The tiled display device TD may be obtained (or formed, etc.) by connecting the non-display areas NDA of the display devices 10 to each other. The display devices 10 may be connected to one another via a bonding member or an adhesive member disposed in the bonding areas SM. A pad portion and a flexible film attached to the pad portion may not be included in the bonding areas SM of the display devices 10. Thus, the distance between the display areas DA of adjacent display devices 10 may be so close (or so small) that the bonding areas SM of the display devices 10 may be almost invisible to the user. The reflectance of the display areas DA of the display devices 10 may be substantially the same as the reflectance of the bonding areas SM of the display devices 10. Thus, the tiled display device TD may reduce or prevent any sense of discontinuity between the display devices 10 and improve the degree of immersion of an image by reducing or preventing a user from recognizing the bonding areas SM of the display devices 10.

The display devices 10 may include a plurality of pixels, which are arranged in multiple rows and multiple columns, in the display areas DA. Each of the pixels may have an emission area LA, which is defined by a pixel-defining film or a bank, and may emit light having a peak wavelength at (or from) the emission area LA. In one example, each of the display areas DA of the display devices 10 may include first emission areas LA1, second emission areas LA2, and third emission areas LA3. The first emission areas LA1, the second emission areas LA2, and the third emission areas LA3 may be areas that emit light generated by light-emitting elements of each of the display devices 10 to the outside of each of the display devices 10.

The first emission areas LA1, the second emission areas LA2, and the third emission areas LA3 may emit light having a peak wavelength to the outside of each of the display devices 10. The first emission areas LA1, the second emission areas LA2, and the third emission areas LA3 may emit first-color light, second-color light, and third-color light, respectively. In one example, the first-color light may be red light having a peak wavelength in a range of about 610 nm to about 650 nm, the second-color light may be green light having a peak wavelength in a range of about 510 nm to about 550 nm, and the third-color light may be blue light having a peak wavelength in a range of about 440 nm to about 480 nm. However, the present disclosure is not limited to this example.

The first emission areas LA1, the second emission areas LA2, and the third emission areas LA3 may be sequentially arranged in the first direction (e.g., the X-axis direction) in each of the display areas DA. In one example, the first emission areas LA1 may be larger in size than the second emission areas LA2, and the second emission areas LA2 may be larger in size than the third emission area LA3. In another example, the first emission areas LA1, the second emission areas LA2, and the third emission areas LA3 may have substantially the same size.

Each of the display areas DA of the display devices 10 may include a light-blocking area BA, which surrounds (or extends around a periphery of) the first emission areas LA1, the second emission areas LA2, and the third emission areas LA3. The light-blocking area BA may prevent beams of light emitted from the first emission areas LA1, the second emission areas LA2, and the third emission areas LA3 from being mixed together.

The tiled display device TD may include first through fourth display devices 10-1 through 10-4. The number of display devices 10 included in the tiled display device TD and how the display devices 10 are connected to one another are not particularly limited. The number of display devices 10 included in the tiled display device TD may be determined by the size of the display devices 10 and the size of the tiled display device TD.

First flexible films FPCB1 may be disposed in non-display areas on a first side of the tiled display device TD. In one example, the first flexible films FPCB1 may be disposed in left non-display areas NDA of the first and third display devices 10-1 and 10-3. The first flexible films FPCB1 may be attached on left edge portions of first substrates of the first and third display devices 10-1 and 10-3. First sides of the first flexible films FPCB1 may be connected to first pad connection lines on the first substrates of the first and third display devices 10-1 and 10-3, and second sides of the first flexible films FPCB1 may be connected to gate circuit boards. The first flexible films FPCB1 may transmit gate signals from gate drivers GIC to the display devices 10.

The gate drivers GIC may be disposed on the first flexible films FPCB1 and may be connected to the pixels of each of the display devices 10. In one example, the gate drivers GIC may be integrated circuits (ICs). The gate drivers GIC may generate gate signals based on gate control signals from timing controllers and may sequentially provide the gate signals to gate lines in the display areas DA.

Second flexible films FPCB2 may be disposed in non-display areas on a second side of the tiled display device TD that is adjacent to the first side of the tiled display device TD. In one example, the second flexible films FPCB2 may be disposed in upper non-display areas NDA of the first and second display devices 10-1 and 10-2. The second flexible films FPCB2 may be attached on upper edge portions of the first substrates of the first and second display devices 10-1 and 10-2. First sides of the second flexible films FPCB2 may be connected to second pad connection lines on the first substrates of the first and second display devices 10-1 and 10-2, and second sides of the second flexible films FPCB2 may be connected to source circuit boards. The second flexible films FPCB2 may transmit source voltages or data voltages from source drivers SIC to the display devices 10.

The source drivers SIC may be disposed on the second flexible films FPCB2 and may be connected to the pixels of each of the display devices 10. In one example, the source drivers SIC may be ICs. The source drivers SIC may convert digital video data into analog data voltages based on source control signals from the timing controllers and may sequentially provide the data voltages to data lines in the display areas DA.

In some embodiments, first flexible films FPCB1 may be additionally disposed in right non-display areas NDA of the second and fourth display devices 10-2 and 10-4, and second flexible films FPCB2 may be additionally disposed in lower display areas NDA of the third and fourth display devices 10-3 and 10-4. However, the present disclosure is not limited to this.

Figure 2:
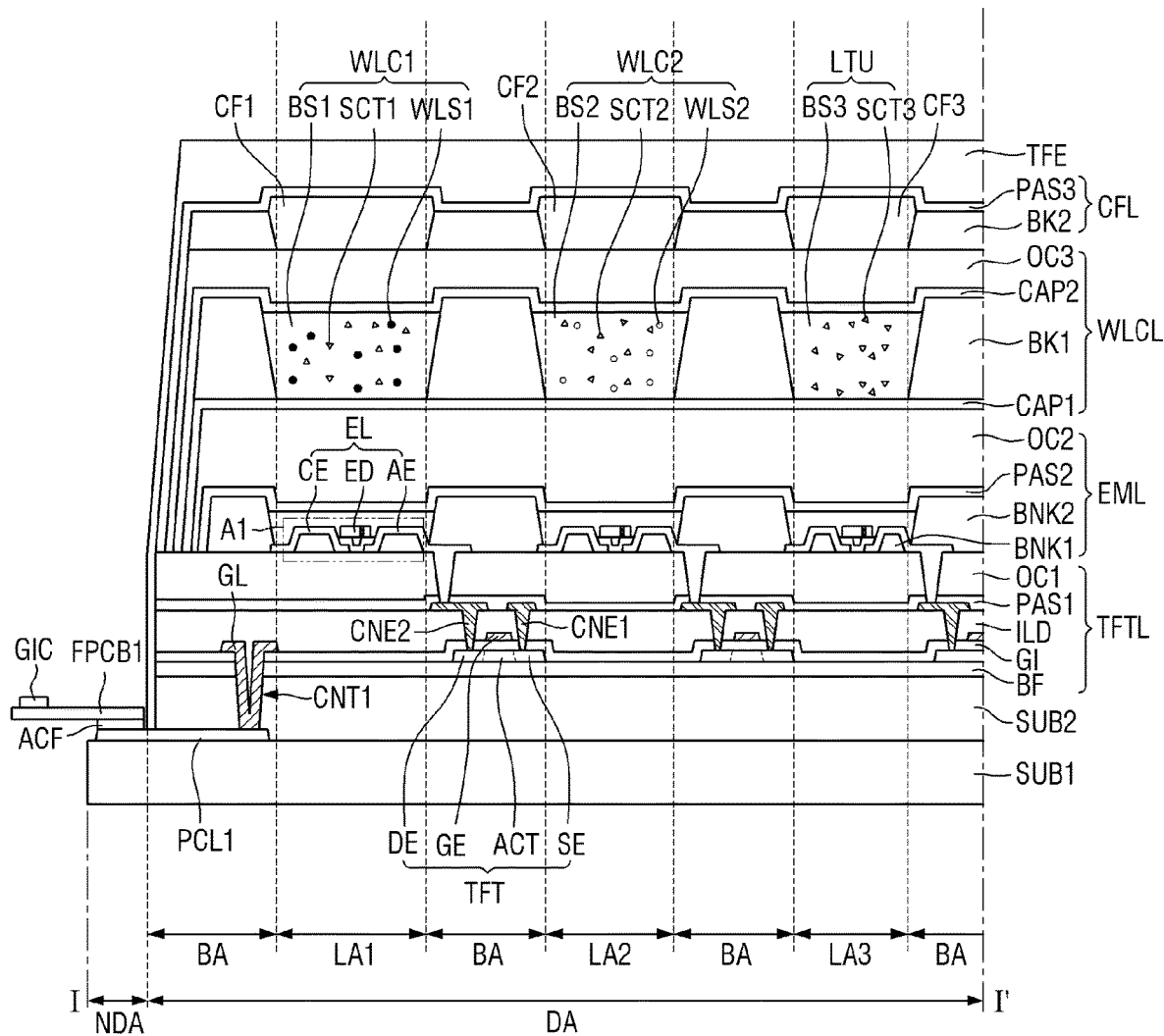
FIG. 2 is a cross-sectional view taken along the line I-I' of FIG. 1.

FIG. 2 is a cross-sectional view taken along the line I-I' of FIG. 1.

Referring to FIG. 2, the display area DA of the display device 10 may include the first, second, and third emission areas LA1, LA2, and LA3. The first, second, and third emission areas LA1, LA2, and LA3 may be areas that emit light generated by light-emitting elements of a plurality of pixels to the outside of the display device 10.

The display device 10 may include a first substrate SUB1, a second substrate SUB2, a display layer DPL, an encapsulation layer TFE, a first pad connection line PCL1, a connection film ACF, a first flexible film FPCB1, and a gate driver GIC.

The first substrate SUB1 may be a base substrate or a base member. A first end portion of the first substrate SUB1 may protrude beyond a first end portion of the second substrate SUB2 in the opposite direction of the first direction (e.g., the X-axis direction). The protruding first end portion of the first substrate SUB1 may support the first flexible film FPCB1. In one example, the first substrate SUB1 may include a glass material or a metallic material, but the present disclosure is not limited thereto. In another example, the first substrate SUB1 may include a polymer resin, such as polyimide (PI), but the present disclosure is not limited thereto.

The second substrate SUB2 may be disposed on the first substrate SUB1. The second substrate SUB2 may be a base substrate or a base member. The second substrate SUB2 may cover part of the first pad connection line PCL1 and the first substrate SUB1. A side surface of the second substrate SUB2 may be surrounded by (or covered by) the encapsulation layer TFE. The second substrate SUB2 may have a first contact opening (e.g., a first contact hole) CNT1, through which a gate line GL passes. The first contact opening CNT1 may penetrate a gate insulating film GI, a buffer layer BF, and the second substrate SUB2.

The second substrate SUB2 may include a different material from the first substrate SUB1. In one example, in a case where the first substrate SUB1 includes a glass material or a metallic material, the second substrate SUB2 may include a polymer resin such as PI. In another example, in a case where the first substrate SUB1 includes a polymer resin such as PI, the second substrate SUB2 may include a glass material or a metallic material.

The display layer DPL may be disposed on the second substrate SUB2. The display layer DPL may include a thin-film transistor (TFT) layer TFTL, a light-emitting element layer EML, a wavelength conversion layer WLCL, and a color filter layer CFL.

The TFT layer TFTL may be disposed on the second substrate SUB2. The TFT layer TFTL may include a buffer layer (or buffer film) BF, TFTs "TFT", the gate insulating film GI, the gate line GL, an interlayer insulating film ILD, first connecting electrodes CNE1, second connecting electrodes CNE2, a first passivation layer PAS1, and a first planarization layer OC1.

The buffer layer BF may be disposed on the second substrate SUB2. The buffer layer BF may include an inorganic material capable of preventing or substantially preventing the infiltration of air or moisture. In one example, the buffer layer BF may include a plurality of inorganic films that are alternately stacked. The first contact opening CNT1, through which the gate line GL passes, may extend through the buffer layer BF. The first contact opening CNT1 may penetrate the gate insulating film GI, the buffer layer BF, and the second substrate SUB2.

The TFTs "TFT" may be disposed in the display area DA, on the buffer layer BF, and may form the pixel circuits of the pixels. In one example, the TFTs "TFT" may be driving or switching transistors of the pixel circuits. The TFTs "TFT" may include semiconductor areas ACT, gate electrodes GE, source electrodes SE, and drain electrodes DE.

The semiconductor areas ACT, the source electrodes SE, and the drain electrodes DE of the TFTs "TFT" may be disposed on the buffer layer BF. The semiconductor areas ACT may overlap the gate electrodes GE in a thickness direction (e.g., a Z-axis direction) and may be insulated from the gate electrodes GE by the gate insulating film GI. The source electrodes SE and the drain electrodes DE may be obtained by transforming the material of the semiconductor areas ACT into conductors.

The gate electrodes GE may be disposed on the gate insulating film GI. The gate electrodes GE may overlap the semiconductor areas ACT with the gate insulating film GI interposed therebetween.

The gate insulating film GI may be disposed on the semiconductor areas ACT, the source electrodes SE, and the drain electrodes DE. In one example, the gate insulating film GI may cover the semiconductor areas ACT, the source electrodes SE, the drain electrodes DE, and the buffer layer BF and may insulate the semiconductor areas ACT and the gate electrodes GE. The first contact opening CNT1, through which the gate line GL passes, may pass through the gate insulating film GI. The first contact opening CNT1 may penetrate the gate insulating film GI, the buffer layer BF, and the second substrate SUB2. The gate insulating film GI may further include contact openings (e.g., contact holes) through which the first connecting electrodes CNE1 and the second connecting electrodes CNE2 may pass.

The gate line GL may be disposed on the gate insulating film GI. The gate line GL may be formed on the same layer, and may include the same material as, the gate electrodes GE of the TFTs "TFT". The gate line GL may be connected between the gate driver GIC and the gate electrodes GE of the TFTs "TFT". The gate line GL may extend in the first direction (e.g., the X-axis direction) in the display area DA. One end portion of the gate line GL may be in the first contact opening CNT1 and may contact the first pad connection line PCL1. The gate line GL may be connected to the first flexible film FPCB1 and the gate driver GIC via the first pad connection line PCL1. The gate line GL may receive a gate signal from the gate driver GIC and may provide the gate signal to the gate electrodes GE of the TFTs "TFT".

The interlayer insulating film ILD may be disposed on the gate electrodes GE and the gate insulating film GI. The interlayer insulating film ILD may have contact openings (e.g., contact holes) through which the first connecting electrodes CNE1 and the second connecting electrodes CNE2 may pass. The contact openings in the interlayer insulating film ILD may be connected to (e.g., may communicate with) the contact openings in the gate insulating film GI.

The first connecting electrodes CNE1 and the second connecting electrodes CNE2 may be disposed on the interlayer insulating film ILD to be spaced apart from one another. The first connecting electrodes CNE1 may connect data lines or power supply lines and the source electrodes SE of the TFTs "TFT". The first connecting electrodes CNE1 may contact the source electrodes SE through the contact openings in each of the gate insulating film GI and the interlayer insulating film ILD.

The second connecting electrodes CNE2 may connect the drain electrodes DE of the TFTs "TFT" and first electrodes AE of light-emitting elements EL. The second connecting electrodes CNE2 may contact the drain electrodes DE through the contact openings in each of the gate insulating film GI and the interlayer insulating film ILD.

The first passivation layer PAS1 may be provided on the first connecting electrodes CNE1 and the second connecting electrodes CNE2 to protect the TFTs "TFT". The first passivation layer PAS1 may have contact openings (e.g., contact holes) through which the first electrodes AE may pass in the display area DA.

The first planarization layer OC1 may be provided on the first passivation layer PAS1 to planarize the tops of the TFTs "TFT". In one example, the first planarization layer OC1 may have contact openings (e.g., contact holes) through which the first electrodes AE may pass. The contact openings in the first planarization layer OC1 may be connected to the contact openings in the first passivation layer PAS1. The first planarization layer OC1 may include an organic material.

The light-emitting element layer EML may include the light-emitting elements EL, first banks BNK1, second banks BNK2, a second passivation layer PAS2, and a second planarization layer OC2.

The light-emitting elements EL may be disposed on the TFT layer TFTL. The light-emitting elements EL may include the first electrodes AE, second electrodes CE, and light-emitting diodes (LEDs) "ED".

The first electrodes AE may be disposed on the first planarization layer OC1. In one example, the first electrodes AE may be disposed on the first banks BNK1, which are provided on the first planarization layer OC1, to cover the first banks BNK1. Each of the first electrodes AE may overlap one of the first, second, and third areas LA1, LA2, and LA3, which are defined by the second banks BNK2, in the thickness direction (e.g., the Z-axis direction). The first electrodes AE may be connected to the drain electrodes DE of the TFTs "TFT" to receive a driving current. The first electrodes AE may be the anodes of the light-emitting elements EL, but the present disclosure is not limited thereto.

The second electrodes CE may be disposed on the first planarization layer OC1 to be spaced apart from the first electrodes AE. In one example, the second electrodes CE may be disposed on the first banks BNK1, which are on the first planarization layer OC1, to cover the first banks BNK1. Each of the second electrodes CE may overlap one of the first, second, and third areas LA1, LA2, and LA3, which are defined by the second banks BNK2, in the thickness direction (e.g., the Z-axis direction). In one example, the second electrodes CE may receive a common voltage provided to all the pixels. The second electrodes CE may be the cathodes of the light-emitting elements EL, but the present disclosure is not limited thereto.

The LEDs "ED" may be disposed between the first electrodes AE and the second electrodes CE on the first planarization layer OC1. First ends of the LEDs "ED" may be connected to the first electrodes AE, and second ends of the LEDs "ED" may be connected to the second electrodes CE. The LEDs "ED" may include active layers having (or formed of) the same material and, thus, may emit light of the same wavelength range and/or of the same color. Light emitted from the first, second, and third emission areas LA1, LA2, and LA3 may have the same color. In one example, the LEDs "ED" may emit third-color light (e.g., blue light) having a peak wavelength in a range of about 440 nm to about 480 nm. Accordingly, the light-emitting element layer EML may emit third-color light (e.g., blue light).

The second banks BNK2 may be disposed on the first planarization layer OC1 to define the first, second, and third emission areas LA1, LA2, and LA3. In one example, the second banks BNK2 may surround (or extend around a periphery of) the first, second, and third emission areas LA1, LA2, and LA3, but the present disclosure is not limited thereto. The second banks BNK2 may isolate and insulate the first electrodes AE or the second electrodes CE of the light-emitting elements EL. The second banks BNK2 may be disposed in the light-blocking area BA.

The second passivation layer PAS2 may be disposed on the light-emitting elements EL and the second banks BNK2. The second passivation layer PAS2 may cover and protect the light-emitting elements EL. The second passivation layer PAS2 may prevent damage to the light-emitting elements EL by preventing or substantially preventing the infiltration of impurities from the outside such as moisture or the air.

The second planarization layer OC2 may be disposed on the second passivation layer PAS2 to planarize the top of the light-emitting element layer EML. In one example, the second planarization layer OC2 may include an organic material.

The wavelength conversion layer WLCL may include a first capping layer CAP1, first light-blocking members BK1, a first wavelength converter WLC1, a second wavelength converter WLC2, a light transmitter LTU, a second capping layer CAP2, and a third planarization layer OC3.

The first capping layer CAP1 may be disposed on the second planarization layer OC2 of the light-emitting element layer EML. The first capping layer CAP1 may seal the bottom surfaces of the first wavelength converter WLC1, the second wavelength converter WLC2, and the light transmitter LTU. In one example, the first capping layer CAP1 may include an inorganic material.

The first light-blocking members BK1 may be disposed in the light-blocking area BA on the first capping layer CAP1. The first light-blocking members BK1 may overlap the second banks BNK2 in the thickness direction (e.g., the Z-axis direction). The first light-blocking members BK1 may block or substantially block the transmission of light. The first light-blocking members BK1 may improve the color reproducibility of the display device 10 by preventing or substantially preventing light emitted from the first, second, and third emission areas LA1, LA2, and LA3 from being mixed together. In one example, in a plan view, the first light-blocking members BK1 may be arranged in a lattice form to surround (or extend around a periphery of) the first, second, and third emission areas LA1, LA2, and LA3.

The first wavelength converter WLC1 may be disposed in the first emission area LA1 on the first capping layer CAP1. The first wavelength converter WLC1 may be surrounded by (e.g., surrounded along a periphery by) the first light-blocking members BK1. The first wavelength converter WLC1 may include a first base resin BS1, a first scatterer SCT1, and a first wavelength shifter WLS1.

The first base resin BS1 may include a material with relatively high light transmittance. The first base resin BS1 may include (or may be formed of) a transparent organic material. In one example, the first base resin BS1 may include at least one of the following organic materials: an epoxy resin, an acrylic resin, a cardo resin, and an imide resin.

The first scatterer SCT1 may have a different refractive index from the first base resin BS1 and may form an optical interface with the first base resin BS1. In one example, the first scatterer SCT1 may include a light-scattering material or light-scattering particles configured to scatter at least some of light passing through the first wavelength converter WLC1. In one example, the first scatterer SCT1 may include a metal oxide, such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or organic particles, such as particles of an acrylic resin or a urethane resin. The first scatterer SCT1 may scatter light in random directions, regardless of the incidence direction of light incident thereupon without substantially changing the peak wavelength of the incident light.

The first wavelength shifter WLS1 may convert or shift the peak wavelength of incident light into a first peak wavelength. In one example, the first wavelength shifter WLS1 may convert blue light provided by (e.g., emitted by) the light-emitting element layer EML into red light having a peak wavelength in a range of about 610 nm to about 650 nm and may emit the red light. The first wavelength shifter WLS1 may include quantum dots, quantum rods, or a phosphor. The quantum dots may be a particulate material that emits light of a particular color in response to the transition of the electrons from a conduction band to a valence band.

Some of the blue light provided by the light-emitting element layer EML may not be converted into red light by the first wavelength shifter WLS1 but may pass through the first wavelength converter WLC1. Blue light incident upon a first color filter CF1 without being converted into red light by the first wavelength shifter WLS1 may be blocked by the first color filter CF1. Red light obtained from blue light by the first wavelength converter WLC1 may pass through the first color filter CF1 and may then be emitted to the outside of the display device 10. Accordingly, the first emission area LA1 may emit red light.

The second wavelength converter WLC2 may be disposed in the second emission area LA2 on the first capping layer CAP1. The second wavelength converter WLC2 may be surrounded by (e.g., surrounded along a periphery by) the first light-blocking members BK1. The second wavelength converter WLC2 may include a second base resin BS2, a second scatterer SCT2, and a second wavelength shifter WLS2.

The second base resin BS2 may include a material with relatively high light transmittance. The second base resin BS2 may include (or may be formed of) a transparent organic material. In one example, the second base resin BS2 may include the same material as the first base resin BS1.

The second scatterer SCT2 may have a different refractive index from the second base resin BS2 and may form an optical interface with the second base resin BS2. In one example, the second scatterer SCT2 may include a light-scattering material or light-scattering particles configured to scatter at least some of light passing through the second wavelength converter WLC2. In one example, the second scatterer SCT2 may include the same material as the first scatterer SCT1. The second scatterer SCT2 may scatter light in random directions, regardless of the incidence direction of light incident thereupon without substantially changing the peak wavelength of the incident light.

The second wavelength shifter WLS2 may convert or shift the peak wavelength of incident light into a second peak wavelength, which is different from the first peak wavelength. In one example, the second wavelength shifter WLS2 may convert blue light provided by (e.g., emitted by) the light-emitting element layer EML into green light having a peak wavelength in a range of about 510 nm to about 550 nm and may emit the green light. The second wavelength shifter WLS2 may include quantum dots, quantum rods, or a phosphor. The second wavelength shifter WLS2 may include the same material as the first wavelength shifter WLS1. The second wavelength shifter WLS2 may be formed as quantum dots, quantum rods, or a phosphor having a different wavelength conversion range from the first wavelength shifter WLS1.

The light transmitter LTU may be disposed in the third emission area LA3 on the first capping layer CAP1. The light transmitter LTU may be surrounded by (e.g., surrounded along a periphery by) the first light-blocking members BK1. The light transmitter LTU may transmit incident light therethrough while maintaining the peak wavelength of the incident light. The light transmitter LTU may include a third base resin BS3 and a third scatterer SCT3.

The third base resin BS3 may include a material with relatively high light transmittance. The third base resin BS3 may include (or may be formed of) a transparent organic material. In one example, the third base resin BS3 may include the same material as the first or second base resin BS1 or BS2.

The third scatterer SCT3 may have a different refractive index from the third base resin BS3 and may form an optical interface with the third base resin BS3. In one example, the third scatterer SCT3 may include a light-scattering material or light-scattering particles configured to scatter at least some of light passing through the light transmitter LTU. In one example, the third scatterer SCT3 may include the same material as the first or second scatterer SCT1 or SCT2. The third scatterer SCT3 may scatter light in random directions, regardless of the incidence direction of light incident thereupon without substantially changing the peak wavelength of the incident light.

Because the wavelength conversion layer WLCL is disposed directly on the second planarization layer OC2 of the light-emitting element layer EML, the display device 10 may not need (or may omit) a separate substrate or a base member for the first wavelength converter WLC1, the second wavelength converter WLC2, and the light transmitter LTU. Thus, the first wavelength converter WLC1, the second wavelength converter WLC2, and the light transmitter LTU can be easily aligned in the first, second, and third emission areas LA1, LA2, and LA3, respectively, and the thickness of the display device 10 can be reduced.

The second capping layer CAP2 may cover the first wavelength converter WLC1, the second wavelength converter WLC2, the light transmitter LTU, and the first light-blocking members BK1. In one example, the second capping layer CAP2 may seal the first wavelength converter WLC1, the second wavelength converter WLC2, and the light transmitter LTU and may thereby prevent or substantially prevent the first wavelength converter WLC1, the second wavelength converter WLC2, and the light transmitter LTU from being damaged or polluted. In one example, the second capping layer CAP2 may include an inorganic material.

The third planarization layer OC3 may be disposed on the second capping layer CAP2 to planarize the tops of the first wavelength converter WLC1, the second wavelength converter WLC2, and the light transmitter LTU. In one example, the third planarization layer OC3 may include an organic material.

The color filter layer CFL may include second light-blocking members BK2, the first color filter CF1, a second color filter CF2, a third color filter CF3, and a third passivation layer PAS3.

The second light-blocking members BK2 may be disposed in the light-blocking area BA on the third planarization layer OC3. The second light-blocking members BK2 may overlap the first light-blocking members BK1 and/or the second banks BNK2 in the thickness direction (e.g., the Z-axis direction). The second light-blocking members BK2 may block or substantially block the transmission of light. The second light-blocking members BK2 may improve the color reproducibility of the display device 10 by preventing or substantially preventing light emitted from the first, second, and third emission areas LA1, LA2, and LA3 from being mixed together. In one example, in a plan view, the second light-blocking members BK2 may be arranged in a lattice form to surround (or to extend around a periphery of) the first, second, and third emission areas LA1, LA2, and LA3.

The first color filter CF1 may be disposed in the first emission area LA1 on the third planarization layer OC3. The first color filter CF1 may be surrounded by (e.g., may be surrounded along its periphery by) the second light-blocking members BK2. The first color filter CF1 may overlap the first wavelength converter WLC1 in the thickness direction (e.g., the Z-axis direction). The first color filter CF1 may selectively transmit first-color light (e.g., red light) therethrough and may block or absorb (or substantially block or absorb) second-color light (e.g., green light) and third-color light (e.g., blue light). In one example, the first color filter CF1 may be a red filter and may include a red colorant.

The second color filter CF2 may be disposed in the second emission area LA2 on the third planarization layer OC3. The second color filter CF2 may be surrounded by (e.g., may be surrounded along its periphery by) the second light-blocking members BK2. The second color filter CF2 may overlap the second wavelength converter WLC2 in the thickness direction (e.g., the Z-axis direction). The second color filter CF2 may selectively transmit second-color light (e.g., green light) therethrough and may block or absorb (or substantially block or absorb) first-color light (e.g., red light) and third-color light (e.g., blue light). In one example, the second color filter CF2 may be a green filter and may include a green colorant.

The third color filter CF3 may be disposed in the third emission area LA3 on the third planarization layer OC3. The third color filter CF3 may be surrounded by (e.g., may be surrounded along its periphery by) the second light-blocking members BK2. The third color filter CF3 may overlap the light transmitter LTU in the thickness direction (e.g., the Z-axis direction). The third color filter CF3 may selectively transmit third-color light (e.g., blue light) therethrough and may block or absorb (or substantially block or absorb) first-color light (e.g., red light) and second-color light (e.g., green light). In one example, the third color filter CF3 may be a blue filter and may include a blue colorant.

The first, second, and third color filters CF1, CF2, and CF3 may reduce the reflection of external light by absorbing some of the external light. Thus, the first, second, and third color filters CF1, CF2, and CF3 can prevent or substantially prevent color distortions that may be caused by the reflection of external light.

Because the first, second, and third color filters CF1, CF2, and CF3 are disposed directly on the third planarization layer OC3 of the wavelength conversion layer WLCL, the display device 10 may not need (or may omit) a separate substrate or a base member for the first, second, and third color filters CF1, CF2, and CF3. Thus, the thickness of the display device 10 can be reduced.

The third passivation layer PAS3 may cover the first, second, and third color filters CF1, CF2, and CF3. The third passivation layer PAS3 may protect the first, second, and third color filters CF1, CF2, and CF3.

The encapsulation layer TFE may be disposed on the third passivation layer PAS3 of the color filter layer CFL. The encapsulation layer TFE may cover the top surface of the display layer DPL and the side surface of the second substrate SUB2. In one example, the encapsulation layer TFE may include at least one inorganic film and may prevent or substantially prevent the infiltration of oxygen or moisture. The encapsulation layer TFE may also include at least one organic film and may protect the display device, such as from foreign materials (e.g., dust).

The first pad connection line PCL1 may be disposed on an edge portion of the first substrate SUB1. A first end portion of the first pad connection line PCL1 may be disposed on the outside of the encapsulation layer TFE, and a second end portion of the first pad connection line PCL1 may be covered by the second substrate SUB2. In one example, the first end portion of the first pad connection line PCL1 may be disposed in the non-display are NDA, and the second end portion of the first pad connection line PCL1 may be disposed in the display area DA. The first end portion of the first pad connection line PCL1 may be connected to the first flexible film FPCB1 via the connection film ACF, and the second end portion of the first pad connection line PCL1 may be connected to the gate line GL, which extends through the first contact opening CNT1.

The connection film ACF may be disposed on the first end portion of the first pad connection line PCL1. The connection film ACF may attach the first flexible film FPCB1 to the first pad connection line PCL1. One surface of the connection film ACF may be attached to the first flexible film FPCB1, and the other surface of the connection film ACF may be attached to the first pad connection line PCL1. The connection film ACF may include an anisotropic conductive film. When the connection film ACF includes the anisotropic conductive film, the connection film ACF may have conductivity in a region where the first pad connection line PCL1 and a contact pad of the first flexible film FPCB1 contact each other and may electrically connect the first flexible film FPCB1 to the first pad connection line PCL1.

The first flexible film FPCB1 may be attached on the connection film ACF. A first side of the first flexible film FPCB1 may be connected to the first pad connection line PCL1 via the connection film ACF, and a second side of the first flexible film FPCB1 may be connected to a gate circuit board. The first flexible film FPCB1 may transmit a gate signal from the gate driver GIC to the first pad connection line PCL1.

The gate driver GIC may be disposed on the first flexible film FPCB1 and may be connected to the gate line GL via the first flexible film FPCB1 and the first pad connection line PCL1. In one example, the gate driver GIC may be an IC. The gate driver GIC may generate a gate signal based on a gate control signal from a timing controller and may sequentially provide the gate signal to the gate line GL in the display area DA.

Figure 3:
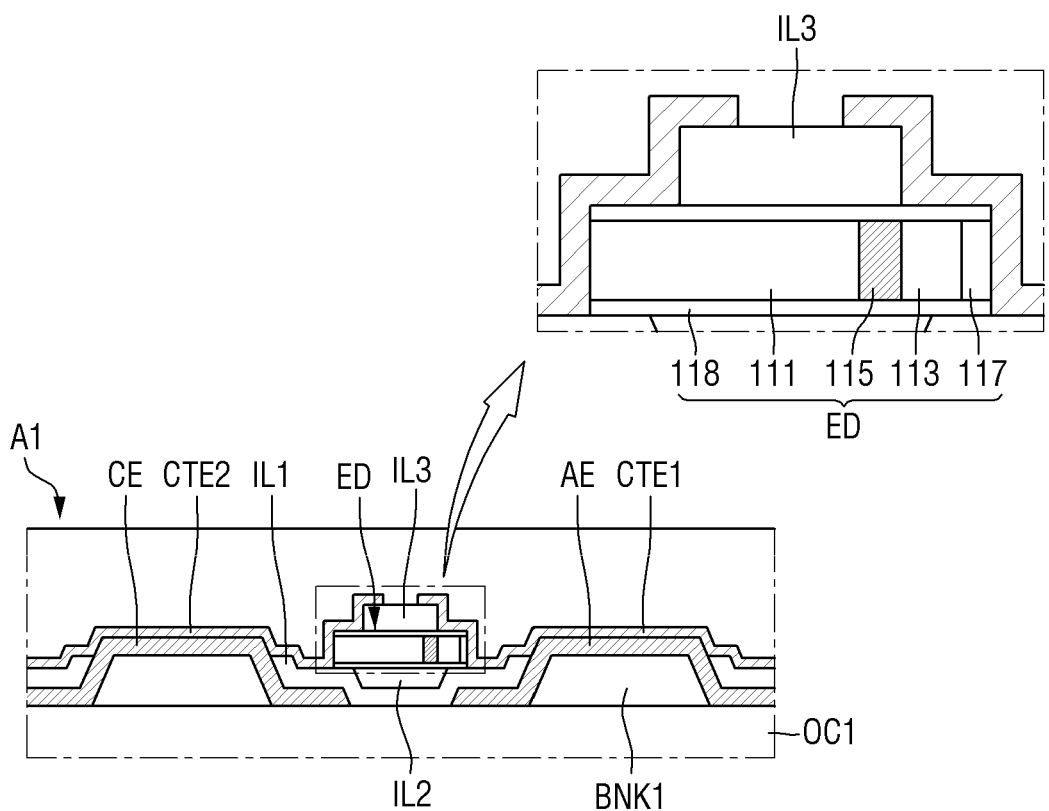
FIG. 3 is an enlarged cross-sectional view of an area A1 of FIG. 2.

FIG. 3 is an enlarged cross-sectional view of the area A1 of FIG. 2.

Referring to FIG. 3, the light-emitting element layer EML of the display device 10 may be disposed on the TFT layer TFTL and may include first, second, and third insulating layers IL1, IL2, and IL3.

A plurality of first banks BNK1 may be disposed in each of the first, second, and third emission areas LA1, LA2, and LA3. Each of the first banks BNK1 may correspond to a first or second electrode AE or CE. The first banks BNK1 may be disposed on the first planarization layer OC1, and the side surfaces of each of the first banks BNK1 may be inclined with respect to the first planarization layer OC1. The first and second electrodes AE and CE may be disposed on their respective first banks BNK1. The first banks BNK1 may include polyimide (PI), but the present disclosure is not limited thereto.

The first and second electrodes AE and CE may include a transparent conductive material. In one example, the first and second electrodes AE and CE may include at least one of indium tin oxide (ITO), indium zinc oxide (IZO), and indium tin zinc oxide (ITZO), but the present disclosure is not limited thereto.

The first and second electrodes AE and CE may include a conductive material with high reflectance. In one example, the first and second electrodes AE and CE may include a metal with high reflectance, such as silver (Ag), copper (Cu), or aluminum (Al). The first and second electrodes AE and CE may reflect light incident thereupon from an LED "ED" in an upward direction of the display device 10.

The first insulating layer IL1 may be disposed on the first planarization layer OC1, the first electrode AE, and the second electrode CE. The first insulating layer IL1 may cover portions of the first and second electrodes AE and CE. In one example, the first insulating layer IL1 may have openings that expose portions of the first and second electrodes AE and CE that correspond to the top surfaces of the first banks BNK1. The first insulating layer IL1 may protect the first and second electrodes AE and CE and may insulate the first and second electrodes AE and CE from each other. The first insulating layer IL1 may prevent or substantially prevent the LED "ED" from contacting, and being damaged by, other elements.

In one example, the first insulating layer IL1 may include an inorganic insulating material and may have a recessed portion (or recessed part or area) between the first and second electrodes AE and CE. The second insulating layer IL2 may fill the recessed portion of the first insulating layer IL1. Thus, the second insulating layer IL2 may planarize the top surface of the first insulating layer IL1, and the LED "ED" may be disposed on the first and second insulating layers IL1 and IL2.

The LED "ED" may be disposed between the first and second electrodes AE and CE on the first and second insulating layers IL1 and IL2. A first end portion of the LED "ED" may be connected to the first electrode AE, and a second end portion of the LED "ED" may be connected to the second electrode CE. In one example, the LED "ED" may be connected to the first electrode AE via a first contact electrode CTE1 and may be connected to the second electrode CE via a second contact electrode CTE2.

The LED "ED" may have a size of several micrometers or nanometers and may be an inorganic LED including an inorganic material. The inorganic LED may be aligned between two opposing electrodes in accordance with an electric field formed in between (e.g., formed in a particular direction between) the two opposing electrodes.

The LED "ED" may include a first semiconductor layer 111, a second semiconductor layer 113, an active layer 115, an electrode layer 117, and an insulating film 118.

The first semiconductor layer 111 may be an n-type semiconductor. In one example, when the LED "ED" emits blue light, the first semiconductor layer 111 may include a semiconductor material, such as $Al_xGa_yIn_{1-x-y}N$ (where $0 \leq x \leq 1$, $0 \leq y \leq 1$, and $0 \leq x+y \leq 1$). The first semiconductor layer 111 may include at least one of the following semiconductor materials: AlGaInN, GaN, AlGaN, InGaN, AlN, and InN that are doped with an n-type dopant. The first semiconductor layer 111 may be doped with an n-type dopant, such as silicon (Si), germanium (Ge), or tin (Sn). The first semiconductor layer 111 may be n-GaN doped with Si, which is an n-type dopant.

The second semiconductor layer 113 may be disposed on the active layer 115. In one example, when the LED "ED" emits blue or green light, the second semiconductor layer 113 may include a semiconductor material, such as $Al_xGa_yIn_{1-x-y}N$ (where $0 \leq x \leq 1$, $0 \leq y \leq 1$, and $0 \leq x+y \leq 1$). The second semiconductor layer 113 may include at least one of the following semiconductor materials: AlGaInN, GaN, AlGaN, InGaN, AlN, and InN that are doped with a p-type dopant. The second semiconductor layer 113 may be doped with a p-type dopant, such as magnesium (Mg), zinc (Zn), calcium (Ca), selenium (Se), or barium (Ba). The second semiconductor layer 113 may be p-GaN doped with Mg, which is a p-type dopant.

The active layer 115 may be disposed between the first and second semiconductor layers 111 and 113. The active layer 115 may include a material having a single- or multi-quantum well structure. When the active layer 115 includes a material having a multi-quantum well structure, a plurality of quantum layers and a plurality of well layers may be alternately stacked in the active layer 115. As electron-hole pairs combine together in response to an electrical signal being applied via the first and second semiconductor layers 111 and 113, the active layer 115 may emit light. In one example, when the active layer 115 emits blue light, the active layer 115 may include a material, such as AlGaN or AlGaInN. When the active layer 115 has a multi-quantum well structure in which quantum layers and well layers are alternately stacked, the quantum layers may include a material, such as AlGaN or AlGaInN, and the well layers may include a material, such as GaN or AlInN. When the active layer 115 includes AlGaInN as its quantum layers and AlInN as its well layers, the active layer 115 may emit blue light.

The electrode layer 117 may be an ohmic contact electrode. In other embodiments, the electrode layer 117 may be a Schottky contact electrode. The LED "ED" may include at least one electrode layer 117. When the LED "ED" is electrically connected to the first or second contact electrode CTE1 or CTE2, the electrode layer 117 may reduce the resistance between the LED "ED" and the first or second contact electrode CTE1 or CTE2. The electrode layer 117 may include a conductive metal.

The insulating film 118 may surround (or extend around a periphery of) multiple semiconductor layers and multiple electrode layers of the LED "ED". The insulating film 118 may surround the outer surface of the active layer 115 and may extend in a direction in which the LED "ED" extends. The insulating film 118 may protect the LED "ED". In one example, the insulating film 118 may surround the side surface of the LED "ED" and may expose both ends (e.g., opposite ends) in a length direction of the LED "ED". When the insulating film 118 covers the active layer 115 and protects the outer surface of the LED "ED", degradation of the emission efficiency of the LED "ED" can be reduced or prevented.

A third insulating layer IL3 may be disposed on a portion of the LED "ED" between the first and second electrodes AE and CE. The third insulating layer IL3 may cover a portion of the outer surface of the LED "ED". The third insulating layer IL3 may protect the LED "ED".

The first contact electrode CTE1 may cover the first electrode AE and a portion of the LED "ED" and may electrically connect the first electrode AE and the LED "ED". The second contact electrode CTE2 may cover the second electrode CE and another portion of the LED "ED" and may electrically connect the second electrode CE and the LED "ED". The first and second contact electrodes CTE1 and CTE2 may include a conductive material. In one example, the first and second contact electrodes CTE1 and CTE2 may include ITO, IZO, ITZO, or Al, but the present disclosure is not limited thereto.

Figure 4:
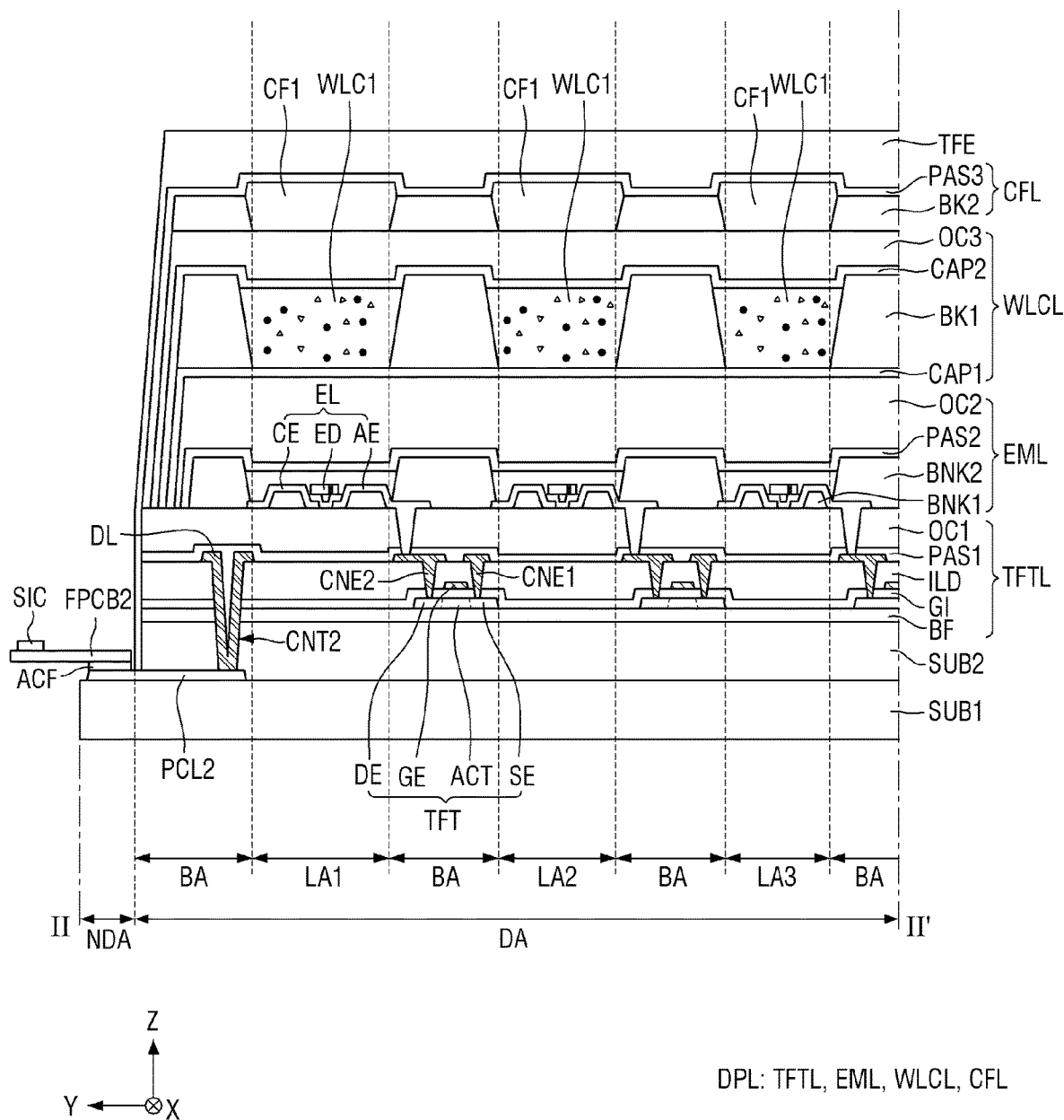
FIG. 4 is a cross-sectional view taken along the line II-II' of FIG. 1.

FIG. 4 is a cross-sectional view taken along the line II-II' of FIG. 1. The display device shown in FIG. 4 differs from the display device shown in FIG. 2 as to a data line DL, a second pad connection line PCL2, a second flexible film FPCB2, and a source driver SIC, and descriptions of elements or features that have already been described above with reference to FIGS. 1 through 3 may be omitted or simplified.

Referring to FIG. 4, the display device 10 may include the first substrate SUB1, the second substrate SUB2, the display layer DPL, the encapsulation layer TFE, the second pad connection line PCL2, the connection film ACF, the second flexible film FPCB2, and the source driver SIC.

The first substrate SUB1 may be a base substrate or a base member. A first end portion of the first substrate SUB1 may protrude beyond a first end portion of the second substrate SUB2 in the opposite direction of the first direction (e.g., the X-axis direction). The protruding first end portion of the first substrate SUB1 may support the second flexible film FPCB2. In one example, the first substrate SUB1 may include a glass material or a metallic material, but the present disclosure is not limited thereto. In another example, the first substrate SUB1 may include a polymer resin, such as polyimide (PI), but the present disclosure is not limited thereto.

The second substrate SUB2 may be disposed on the first substrate SUB1. The second substrate SUB2 may be a base substrate or a base member. The second substrate SUB2 may cover a portion of the second pad connection line PCL2 and the first substrate SUB1. A side surface of the second substrate SUB2 may be surrounded by (e.g., covered by) the encapsulation layer TFE. The second substrate SUB2 may have a second contact opening (e.g., a second contact hole) CNT2, through which the data line DL passes. The second contact opening CNT2 may penetrate the interlayer insulating film ILD, the gate insulating film GI, the buffer layer BF, and the second substrate SUB2.

The second substrate SUB2 may include a different material from the first substrate SUB1. In one example, when the first substrate SUB1 includes a glass material or a metallic material, the second substrate SUB2 may include a polymer resin, such as polyimide (PI). In another example, when the first substrate SUB1 includes a polymer resin such as polyimide (PI), the second substrate SUB2 may include a glass material or a metallic material.

The display layer DPL may be disposed on the second substrate SUB2. The display layer DPL may include the TFT layer TFTL, the light-emitting element layer EML, the wavelength conversion layer WLCL, and the color filter layer CFL.

The TFT layer TFTL may include the buffer layer BF, TFTs "TFT", the gate insulating film GI, the data line DL, the interlayer insulating film ILD, first connecting electrodes CNE1, second connecting electrodes CNE2, the first passivation layer PAS1, and the first planarization layer OC1.

The data line DL may be disposed on the interlayer insulating film ILD. The data line DL may be formed on the same layer, and may include the same material as, the first connecting electrodes CNE1 and CNE2 of the TFT layer TFT. The data line DL may be connected between the source driver SIC and the first connecting electrodes CNE1. The data line DL may extend in the second direction (e.g., the Y-axis direction) in the display area DA. One end portion of the data line DL may pass through the second contact opening CNT2 and may contact the second pad connection line PCL2. The data line DL may be connected to the second flexible film FPCB2 and the source driver SIC via the second pad connection line PCL2. The data line DL may receive a data voltage from the source driver SIC and may provide the data voltage to source electrodes SE of the TFTs "TFT".

The second pad connection line PCL2 may be disposed on an edge portion of the first substrate SUB1. A first end portion of the second pad connection line PCL2 may be disposed on the outside of the encapsulation layer TFE, and a second end portion of the second pad connection line PCL2 may be covered by the second substrate SUB2. In one example, the first end portion of the second pad connection line PCL2 may be disposed in the non-display are NDA, and the second end portion of the second pad connection line PCL2 may be disposed in the display area DA. The first end portion of the second pad connection line PCL2 may be connected to the second flexible film FPCB2 via the connection film ACF, and the second end portion of the second pad connection line PCL2 may be connected to the data line DL, which passes through the second contact opening CNT2.

The connection film ACF may be disposed on the first end portion of the second pad connection line PCL2. The connection film ACF may attach the second flexible film FPCB2 to the second pad connection line PCL2. One surface of the connection film ACF may be attached to the second flexible film FPCB2, and the other surface of the connection film ACF may be attached to the second pad connection line PCL2. The connection film ACF may include an anisotropic conductive film. When the connection film ACF includes the anisotropic conductive film, the connection film ACF may have conductivity in a region where the second pad connection line PCL2 and a contact pad of the second flexible film FPCB2 contact each other and may electrically connect the second flexible film FPCB2 to the second pad connection line PCL2.

The second flexible film FPCB2 may be attached to the connection film ACF. A first side of the second flexible film FPCB2 may be connected to the second pad connection line PCL2 via the connection film ACF, and a second side of the second flexible film FPCB2 may be connected to a source circuit board. The second flexible film FPCB2 may transmit a data voltage from the source driver SIC to the second pad connection line PCL2.

The source driver SIC may be disposed on the second flexible film FPCB2 and may be connected to the data line DL via the second flexible film FPCB2 and the second pad connection line PCL2. In one example, the source driver SIC may be an IC. The source driver SIC may convert digital video data into an analog data voltage based on a source control signal from a timing controller and may provide the analog data voltage to the data line DL in the display area DA via the second flexible film FPCB2.

Figure 5:
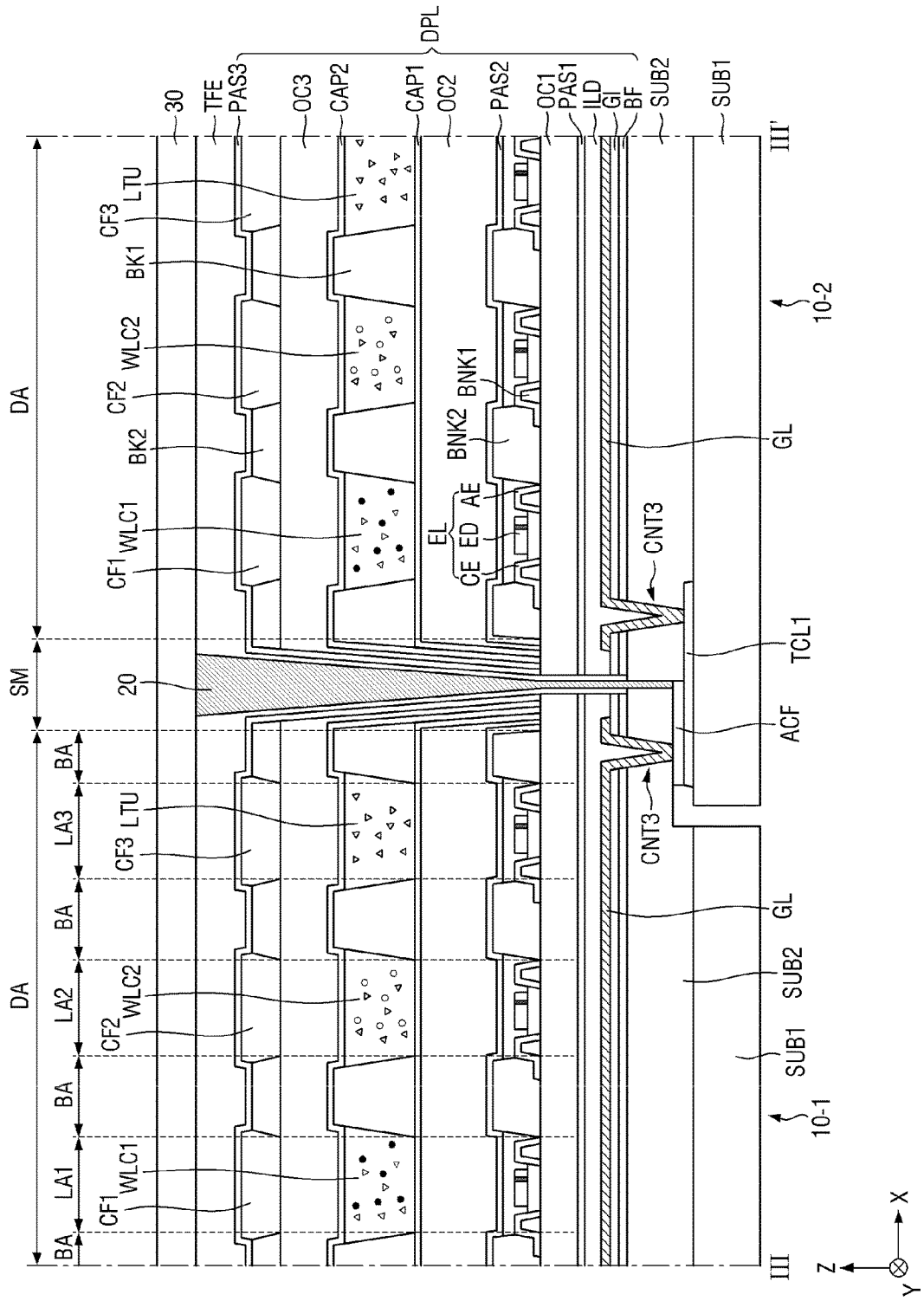
FIG. 5 is a cross-sectional view taken along the line III-III' of FIG. 1.

FIG. 5 is a cross-sectional view taken along the line III-III' of FIG. 1. Descriptions of elements or features that have already been described above with reference to FIGS. 1 through 4 may be omitted or simplified.

Referring to FIG. 5, the tiled display device TD may include multiple display devices 10 (e.g., the first and second display devices 10-1 and 10-2) and a bonding member 20. FIG. 1 illustrates that the tiled display device TD includes the first through fourth display devices 10-1 through 10-4, but the number of display devices 10 included in the tiled display device TD is not particularly limited. The number of display devices 10 included in the tiled display device TD may be determined by the size of the display devices 10 and the size of the tiled display device TD.

The tiled display device TD may have the display areas DA of the first and second display devices 10-1 and 10-2 and a bonding area SM between the display areas DA of the first and second display devices 10-1 and 10-2.

Each of the first and second display devices 10-1 and 10-2 may include the first substrate SUB1, the second substrate SUB2, connection lines, and the gate line GL.

A second end portion of the first substrate SUB1 of the first display device 10-1 that faces the first substrate SUB1 of the second display device 10-2 may be recessed from a second end portion of the second substrate SUB2 of the second display device 10-2 in the opposite direction of the first direction (e.g., the X-axis direction). A first end portion of the first substrate SUB1 of the second display device 10-2 may be projected from a first end portion of the second substrate SUB2 of the second display device 10-2 in the opposite direction of the first direction (e.g., the X-axis direction). Thus, when the first and second display devices 10-1 and 10-2 are coupled to each other, the first end portion of the first substrate SUB1 of the second display device 10-2 may be inserted in the recessed second end portion of the first substrate SUB1 of the first display device 10-1. An edge portion of the first substrate SUB1 of the second display device 10-2 may overlap the second substrate SUB2 of the first display device 10-1 in the thickness direction (e.g., the Z-axis direction).

A first end portion of the second substrate SUB2 of the first display device 10-1, supported by the first substrate SUB1 of the first display device 10-1, may be thicker than a second end portion of the second substrate SUB2 of the first display device 10-1 that overlaps the first substrate SUB1 of the second display device 10-2 in the thickness direction. A connection film ACF and one end portion of a first connection line TCL1 may be disposed between the second end portion of the second substrate SUB2 of the first display device 10-1 and the first end portion of the first substrate SUB1 of the second display device 10-2. In one example, as the thicknesses of the connection film ACF and the first connection line TCL1 increase, the thickness of the second end portion of the second substrate SUB2 of the first display device 10-1 may decrease. Thus, the first substrates SUB1 of the first and second display devices 10-1 and 10-2 may be placed at the same height.

The gate line GL of the first display device 10-1 may be disposed on the gate insulating film GI. A second end portion of the gate line GL of the first display device 10-1 may extend in a third contact opening (e.g., a third contact hole) CNT3 in the first display device 10-1. The third contact opening CNT3 in the first display device 10-1 may be disposed in a right edge portion of the first display device 10-1 in a plan view and may penetrate the gate insulating film GI, a buffer layer BF, and the second substrate SUB2 of the first display device 10-1. The gate line GL of the first display device 10-1 may be in the third contact opening CNT3 in the first display device 10-1 to be connected to the first connection line TCL1 via the connection film ACF.

The tiled display device TD may further include the connection film ACF. The connection film ACF may be disposed between the gate line GL of the first display device 10-1, which is in the third contact opening CNT3 in the first display device 10-1, and the first connection line TCL1 and may electrically connect the gate line GL of the first display device 10-1 and the first connection line TCL1.

The connection lines may be disposed on edge portions of the first substrates SUB1 of the first and second display devices 10-1 and 10-2. FIGS. 1 and 2 illustrate that the connection lines of the first display device 10-1 may include the first pad connection line PCL1, which is disposed on a left edge portion of the first substrate SUB1 of the first display device 10-1. FIGS. 1 and 5 illustrate that the connection lines of the second display device 10-2 may include the first connection line TCL1, which is disposed on a left edge portion of the first substrate SUB1 of the second display device 10-2.

The first connection line TCL1 may be disposed on an edge portion of the first substrate SUB1 of the second display device 10-2. A first end portion of the first connection line TCL1 may overlap the second substrate SUB2 of the first display device 10-1 in the thickness direction (e.g., the Z-axis direction), and a second end portion of the first connection line TCL1 may be covered by the second substrate SUB2 of the second display device 10-2. In one example, the second end portion of the first connection line TCL1 may be disposed in the display area DA of the second display device 10-2, and the first end portion of the first connection line TCL1 may extend into the display area DA of the first display device 10-1. The first end portion of the first connection line TCL1 may be connected to the gate line GL of the first display device 10-1 via the connection film ACF, and the second end portion of the first connection line TCL1 may be connected to the gate line GL of the second display device 10-2.

Thus, the first connection line TCL1 may connect the gate lines GL of the first and second display devices 10-1 and 10-2 to each other. The gate driver GIC disposed on the left side of the first display device 10-1 may provide a gate signal to the gate line GL of the first display device 10-1. The gate line GL of the first display device 10-1 may extend from the left side to the right side of the display area DA of the first display device 10-1 and may extend into the third contact opening CNT3 in the first display device 10-1. The gate signal from the gate line GL of the first display device 10-1 may be provided to the gate line GL of the second display device 10-2 via the first connection line TCL1.

Some of the display devices 10 of the tiled display device TD may include gate drivers GIC, and the other display devices 10 of the tiled display device TD may not include gate drivers GIC. In one example, the first display device 10-1, which includes gate drivers GIC, may provide gate signals to the second display device 10-2, which does not include any gate drivers GIC, via the first connection line TCL1. Thus, the bonding area SM between the first and second display devices 10-1 and 10-2 may not include any gate drivers GIC, and the distance between the first and second display devices 10-1 and 10-2 may be so small that the bonding area SM may be almost invisible to the user.

Because the first end portion of the first connection line TCL1 extends into the display area DA of the first display device 10-1 and, thus, is placed below the second substrate SUB2 of the first display device 10-1, the distance between the first and second display devices 10-1 and 10-2 can be reduced or minimized. Thus, because the first connection line TCL1, which connects the gate lines GL of the first and second display devices 10-1 and 10-2 to each other, is provided, no first flexible films FPCB1 and no gate drivers GIC need to be (or may be) provided in the bonding area SM.

The tiled display device TD may not include any first flexible films FPCB1 and any gate drivers GIC in the bonding areas SM between the display devices 10 of the tiled display device TD, and thus, the distance between the display devices 10 of the tiled display device TD may be so small that the bonding areas SM between the display devices 10 of the tiled display device TD may be almost invisible to the user. The reflectance of the display areas DA of the display devices 10 of the tiled display device TD for external light may be substantially the same as the reflectance of the bonding areas SM between the display devices 10 of the tiled display device TD for external light. Thus, the bonding areas SM between the display devices 10 of the tiled display device TD may not be visible or readily visible to the user. Accordingly, a sense of discontinuity between the display devices 10 of the tiled display device TD can be reduced or eliminated, and the degree of immersion of an image can be improved.

Referring again to FIG. 5, the tiled display device TD may bond the side surfaces of the first and second display devices 10-1 and 10-2 by using a bonding member 20, which is disposed between the first and second display devices 10-1 and 10-2. The bonding member 20 may connect (or extend between) the side surfaces of the first and second display devices 10-1 and 10-2, which are arranged in a lattice pattern together with the third and fourth display devices 10-3 and 10-4 and may realize (or provide) the tiled display device TD. The bonding member 20 may combine the side surfaces of the second substrate SUB2 of the first and second display devices 10-1 and 10-2 together and may combine the side surfaces of encapsulation layers TFE of the first and second display devices 10-1 and 10-2 together. The bonding member 20 may protect the connection film ACF and the first connection line TCL1 and may insulate the first connection line TCL1 from another first connection line TCL1.

In one example, the bonding member 20 may be formed as a relatively thin adhesive or double-sided tape and, thus, may reduce or minimize the distance between the first and second display devices 10-1 and 10-2. In another example, the bonding member 20 may be formed as a relatively thin bonding frame and, thus, may reduce or minimize the distance between the first and second display devices 10-1 and 10-2. Thus, the bonding area SM of the tiled display device TD between the first and second display devices 10-1 and 10-2 may not be visible or readily visible to the user.

A cover member 30 may be disposed on the top surfaces of the first and second display devices 10-1 and 10-2 and the top surface of the bonding member 20 to cover the first and second display devices 10-1 and 10-2 and the bonding member 20. In one example, the cover member 30 may be disposed on the top surfaces of the encapsulation layers TFE of the first and second display devices 10-1 and 10-2. The cover member 30 may protect the top surface of the tiled display device TD.

Figure 6:
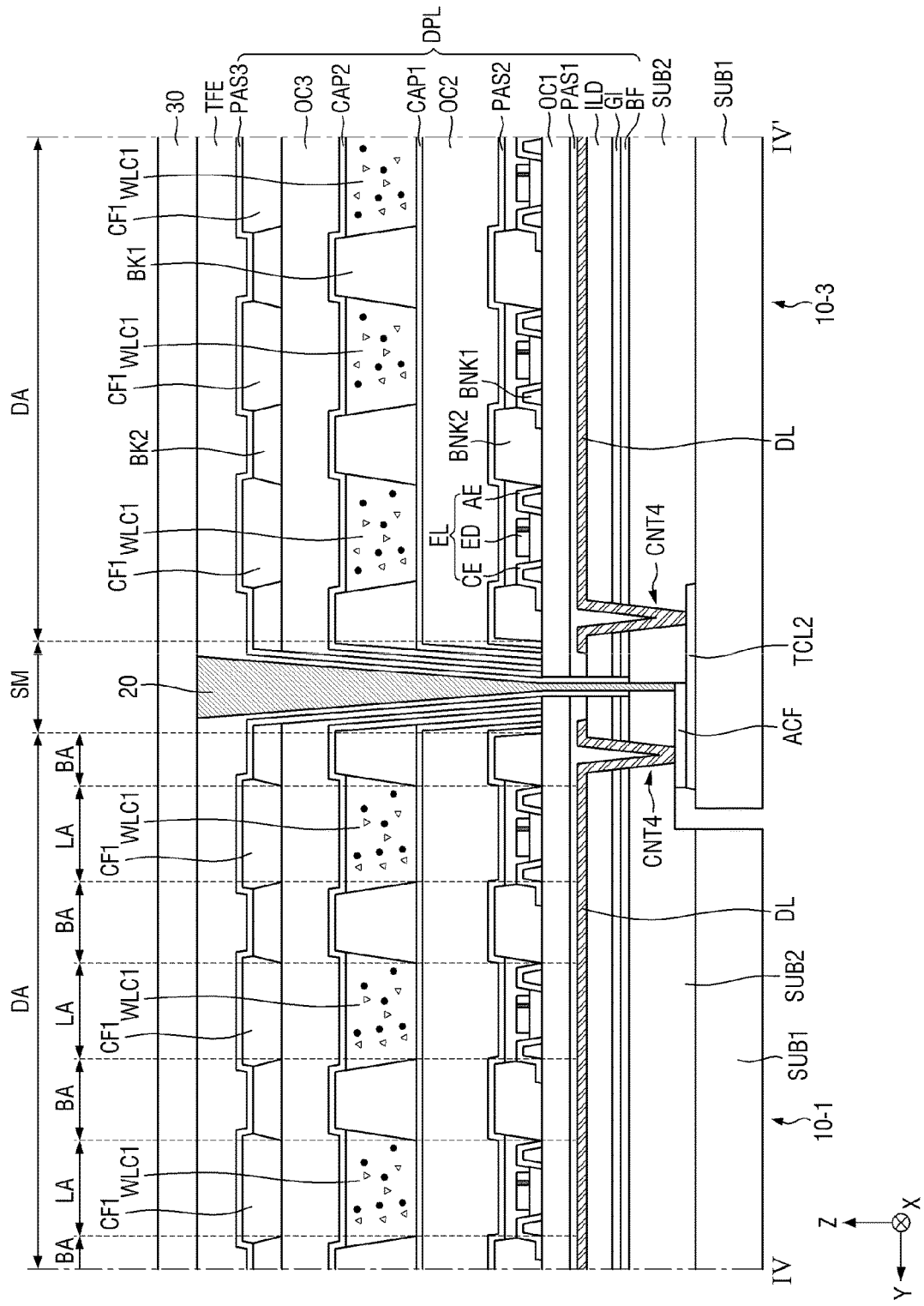
FIG. 6 is a cross-sectional view taken along the line IV-IV' of FIG. 1.

FIG. 6 is a cross-sectional view taken along the line IV-IV' of FIG. 1. Descriptions of elements or features that have already been described above with reference to FIGS. 1 through 5 may be omitted or simplified.

Referring to FIG. 6, the tiled display device TD may have the display areas DA of the first and third display devices 10-1 and 10-3 and a bonding area SM between the display areas DA of the first and third display devices 10-1 and 10-3.

Each of the first and third display devices 10-1 and 10-3 may include the first substrate SUB1, the second substrate SUB2, connection lines, and the data line DL.

A second end portion of the first substrate SUB1 of the first display device 10-1 that faces the first substrate SUB1 of the third display device 10-3 may be recessed from a second end portion of the second substrate SUB2 of the first display device 10-1 in the second direction (e.g., the Y-axis direction). A first end portion of the first substrate SUB1 of the third display device 10-3 may be projected from (e.g., may extend beyond) a first end portion of the second substrate SUB2 of the third display device 10-3 in the second direction (e.g., the Y-axis direction). Thus, when the first and third display devices 10-1 and 10-3 are coupled, the first end portion of the first substrate SUB1 of the third display device 10-3 may be inserted in the recessed second end portion of the first substrate SUB1 of the first display device 10-1. An edge portion of the first substrate SUB1 of the third display device 10-3 may overlap the second substrate SUB2 of the first display device 10-1 in the thickness direction (e.g., the Z-axis direction).

A first end portion of the second substrate SUB2 of the first display device 10-1, supported by the first substrate SUB1 of the first display device 10-1, may be thicker than a second end portion of the second substrate SUB2 of the first display device 10-1 that overlaps the first substrate SUB1 of the third display device 10-3 in the thickness direction. A connection film ACF and one end portion of a second connection line TCL2 may be disposed between the second end portion of the second substrate SUB2 of the first display device 10-1 and the first end portion of the first substrate SUB1 of the third display device 10-3. In one example, as the thicknesses of the connection film ACF and the second connection line TCL2 increase, the thickness of the second end portion of the second substrate SUB2 of the first display device 10-1 may decrease. Thus, the first substrates SUB1 of the first and third display devices 10-1 and 10-3 may be placed at the same height.

The data line DL of the first display device 10-1 may be disposed on the gate insulating film GI. A second end portion of the data line DL of the first display device 10-1 may be in a fourth contact opening (e.g., a fourth contact hole) CNT4 in the first display device 10-1. The fourth contact opening CNT4 in the first display device 10-1 may be disposed in a lower edge portion of the first display device 10-1 in a plan view and may penetrate the interlayer insulating film ILD, the gate insulating film GI, the buffer layer BF, and the second substrate SUB2 of the first display device 10-1. The data line DL of the first display device 10-1 may extend into the fourth contact opening CNT4 in the first display device 10-1 to be connected to the second connection line TCL2 via the connection film ACF.

The tiled display device TD may further include the connection film ACF. The connection film ACF may be disposed between the data line DL of the first display device 10-1, which extends into the fourth contact opening CNT4 in the first display device 10-1, and the second connection line TCL2 and may electrically connect the data line DL of the first display device 10-1 and the second connection line TCL2 to each other.

The connection lines may be disposed on edge portions of the first substrates SUB1 of the first and third display devices 10-1 and 10-3. FIGS. 1 and 4 illustrate that the connection lines of the first display device 10-1 may include the second pad connection line PCL2, which is disposed on an upper edge portion of the first substrate SUB1 of the first display device 10-1. FIGS. 1 and 6 illustrate that the connection lines of the third display device 10-3 may include the second connection line TCL2, which is disposed on an upper edge portion of the first substrate SUB1 of the third display device 10-3.

The second connection line TCL2 may be disposed on an edge portion of the first substrate SUB1 of the third display device 10-3. A first end portion of the second connection line TCL2 may overlap the second substrate SUB2 of the first display device 10-1 in the thickness direction (e.g., the Z-axis direction), and a second end portion of the second connection line TCL2 may be covered by the second substrate SUB2 of the third display device 10-3. In one example, the second end portion of the second connection line TCL2 may be disposed in the display area DA of the third display device 10-3, and the first end portion of the second connection line TCL2 may extend into the display area DA of the first display device 10-1. The first end portion of the second connection line TCL2 may be connected to the data line DL of the first display device 10-1 via the connection film ACF, and the second end portion of the second connection line TCL2 may be connected to the data line DL of the third display device 10-3.

Thus, the second connection line TCL2 may connect the data lines DL of the first and third display devices 10-1 and 10-3 to each other. The source driver SIC disposed on the upper side of the first display device 10-1 may provide a data voltage to the data line DL of the first display device 10-1. The data line DL of the first display device 10-1 may extend from the upper side to the lower side of the display area DA of the first display device 10-1 and may extend into the fourth contact opening CNT4 in the first display device 10-1. The data voltage from the data line DL of the first display device 10-1 may be provided to the data line DL of the third display device 10-3 via the connection film ACF and the second connection line TCL2.

Some of the display devices 10 of the tiled display device TD may include source drivers SIC, and the other display devices 10 of the tiled display device TD may not include source drivers SIC. In one example, the first display device 10-1, which includes source drivers SIC, may provide data voltages to the third display device 10-3, which does not include any source drivers SIC, via the second connection line TCL2. Thus, the bonding area SM between the first and third display devices 10-1 and 10-3 may not include any source drivers SIC, and the distance between the first and third display devices 10-1 and 10-3 may be so small that the bonding area SM may be almost invisible to the user.

Because the first end portion of the second connection line TCL2 extends into the display area DA of the first display device 10-1 and is placed below the second substrate SUB2 of the first display device 10-1, the distance between the first and third display devices 10-1 and 10-3 can be reduced or minimized. Thus, because the second connection line TCL2, which connects the data lines DL of the first and third display devices 10-1 and 10-3 to each other, is provided, no second flexible films FPCB2 and no source drivers SIC need to be (or may be) provided in the bonding area SM between the first and third display devices 10-1 and 10-3.

The tiled display device TD may not include any second flexible films FPCB2 and any source drivers SIC in the bonding areas SM between the display devices 10 of the tiled display device TD, and the distance between the display devices 10 of the tiled display device TD may be so small that the bonding areas SM between the display devices 10 of the tiled display device TD may be almost invisible to the user. The reflectance of the display areas DA of the display devices 10 of the tiled display device TD for external light may be substantially the same as the reflectance of the bonding areas SM between the display devices 10 of the tiled display device TD for external light. Thus, the bonding areas SM between the display devices 10 of the tiled display device TD may not be visible or readily visible to the user. Accordingly, a sense of discontinuity between the display devices 10 of the tiled display device TD can be reduced or eliminated, and the degree of immersion of an image can be improved.

FIGS. 7 through 14 are cross-sectional views illustrating steps of manufacturing the tiled display device shown in FIG. 6. FIGS. 7 through 14 illustrate steps of fabricating the first display device 10-1, and the second through fourth display devices 10-2 through 10-4 may be fabricated in the same or substantially the same manner as the first display device 10-1.

Figure 7:
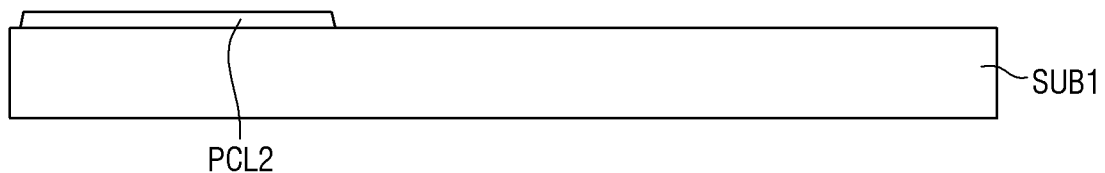
FIGS. 7 through 14 are cross-sectional views illustrating steps of manufacturing the tiled display device shown in FIG. 6.
Figure 7:
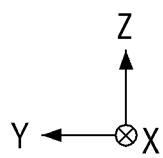

Referring to FIG. 7, the first substrate SUB1 may be a base substrate or a base member. In one example, the first substrate SUB1 may include a glass material or a metallic material, but the present disclosure is not limited thereto.

A second pad connection line PCL2 may be disposed on an edge portion of the first substrate SUB1. In one example, the first pad connection line PCL1 shown in FIG. 2, the first connection line TCL1 shown in FIG. 5, and the second connection line TCL2 shown in FIG. 6 may be formed of the same material and by the same process as the second pad connection line PCL2.

Figure 8:
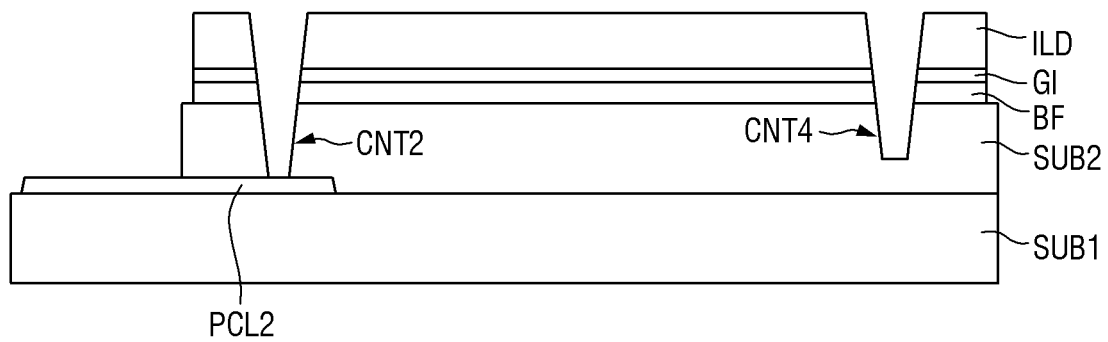
Figure 8:
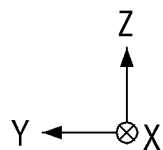

Referring to FIG. 8, the second substrate SUB2 may be disposed on the first substrate SUB1. The second substrate SUB2 may be a base substrate or a base member. The second substrate SUB2 may cover a portion of the second pad connection line PCL2 and the first substrate SUB1. The size of the second substrate SUB2 may be smaller than the size of the first substrate SUB1. Thus, a first end portion of the first substrate SUB1 may protrude from a first end portion of the second substrate SUB2 in the second direction (e.g., the Y-axis direction). A first end portion of the second connection line TCL2 may not be covered by (e.g., may be exposed by) the second substrate SUB2, and a second end portion of the second connection line TCL2 may be covered by the second substrate SUB2.

The buffer layer BF, the gate insulating film GI, and the interlayer insulating film ILD may be sequentially stacked on the second substrate SUB2.

The second contact opening CNT2 may be formed on one side of the second substrate SUB2. The second contact opening CNT2 may penetrate the interlayer insulating film ILD, the gate insulating film GI, the buffer layer BF, and the second substrate SUB2. The top surface of the second end portion of the second pad connection line PCL2 may be exposed by (or through) the second contact opening CNT2.

The fourth contact opening CNT4 may be formed on the other side of the second substrate SUB2. The fourth contact opening CNT4 may penetrate the interlayer insulating film ILD, the gate insulating film GI, the buffer layer BF, and a portion of the second substrate SUB2. In one example, the depth of the fourth contact opening CNT4 may be smaller than the depth of the second contact opening CNT2.

Figure 9:
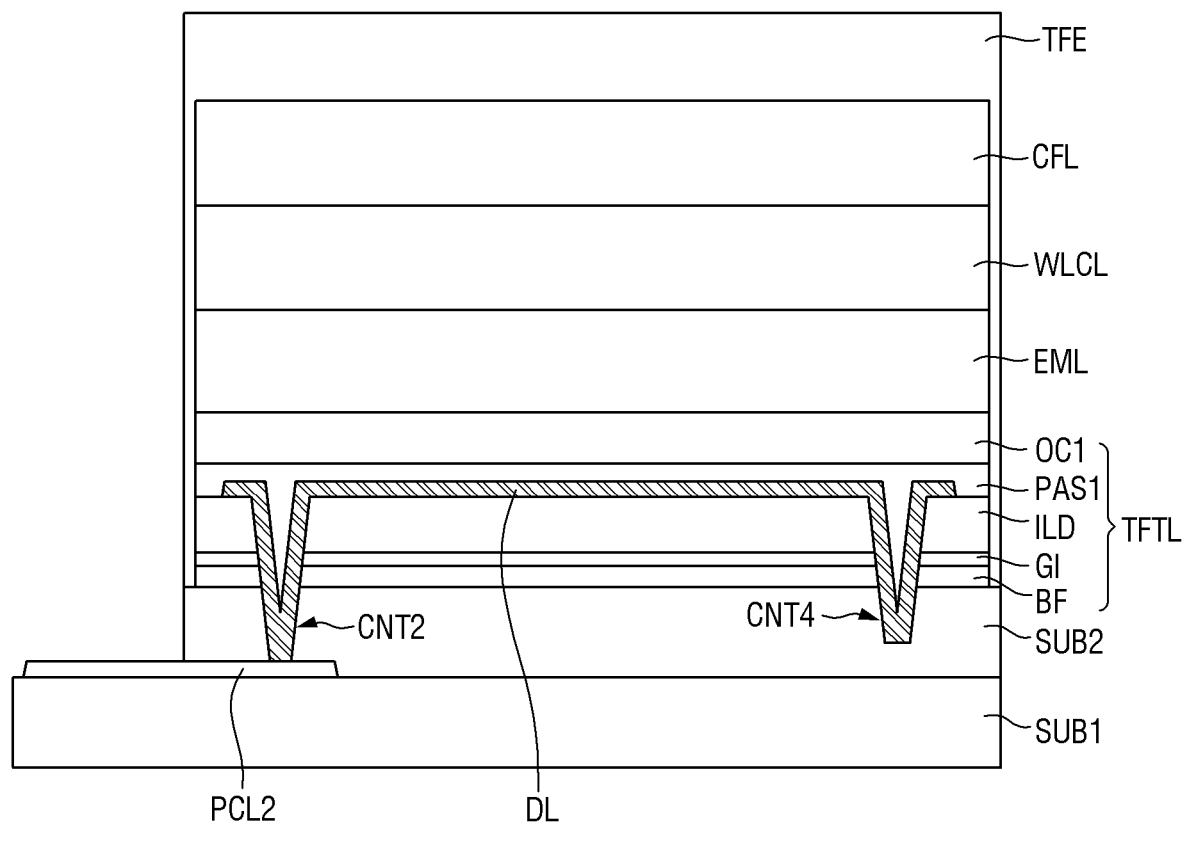

Referring to FIG. 9, a data line DL may be disposed on the interlayer insulating film ILD. One end portion of the data line DL may extend into the second contact opening CNT2 to contact the second pad connection line PCL2, and the other end portion of the data line DL may extend into the fourth contact opening CNT4.

The first passivation layer PAS1 may cover the data line DL and the interlayer insulating film ILD. The first planarization layer OC1, the light-emitting element layer EML, the wavelength conversion layer WLCL, and the color filter layer CFL may be sequentially stacked on the first passivation layer PAS1.

The encapsulation layer TFE may cover the top surface and a side surface of the display layer DPL and a side surface of the second substrate SUB2.

Figure 10:
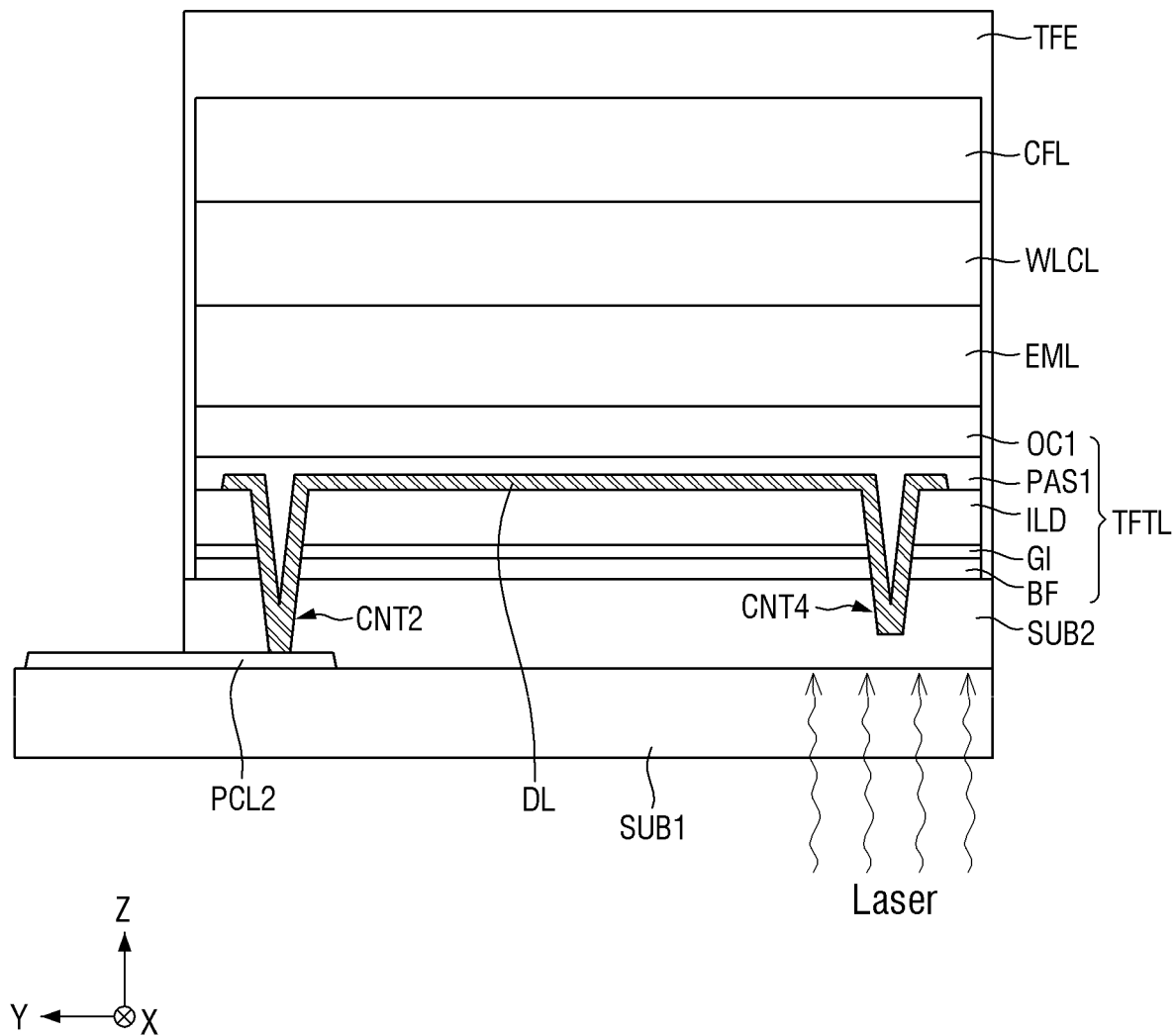

Referring to FIG. 10, a second end portion of the first substrate SUB1 may be delaminated from a second end portion of the second substrate SUB2. In one example, laser light may be applied to the boundary between the second end portions of the first and second substrates SUB1 and SUB2, but the present disclosure is not limited thereto. As a result, the top surface of the second end portion of the first substrate SUB1 may be delaminated from the bottom surface of the second end portion of the second substrate SUB2.

Figure 11:
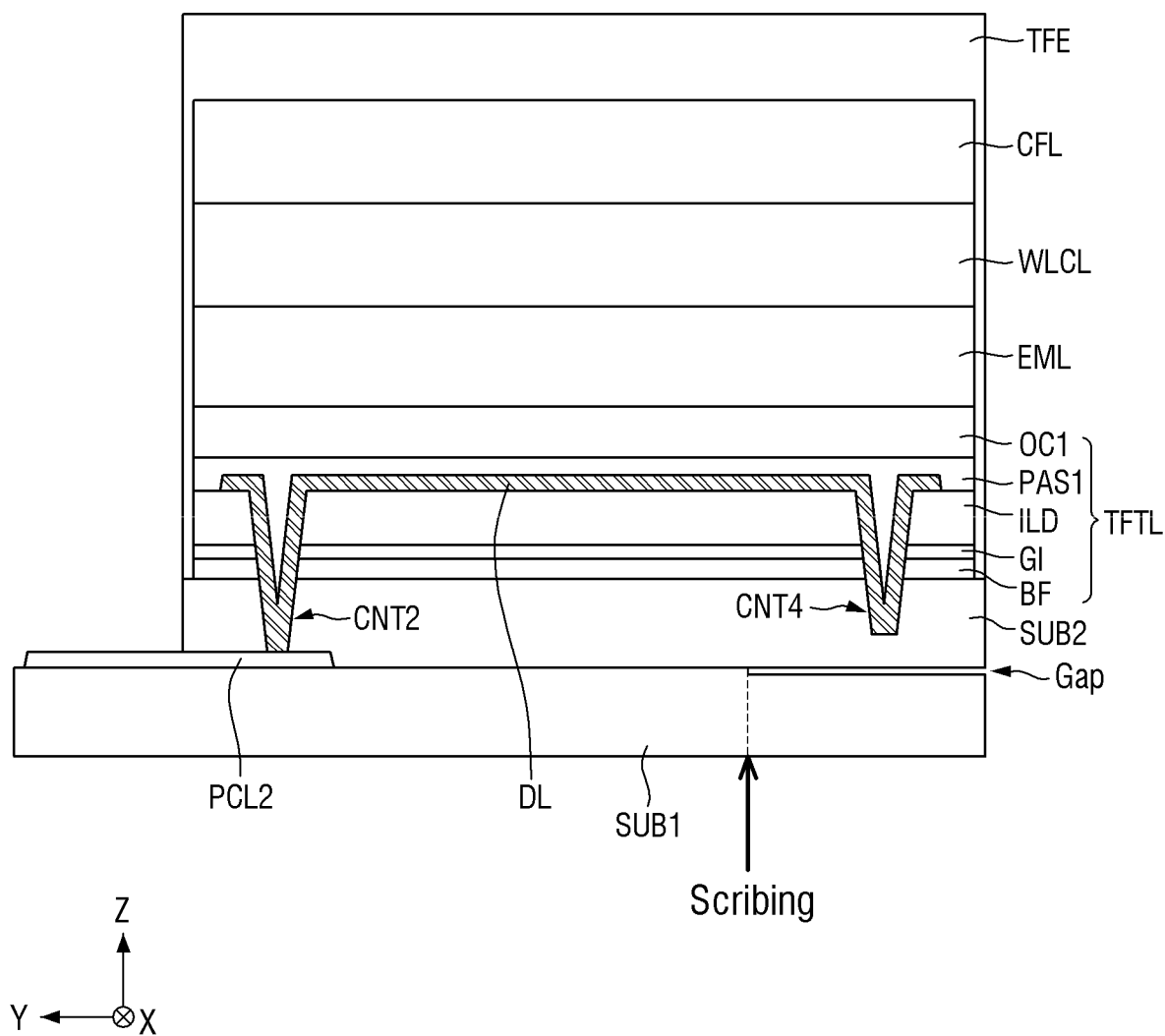

Referring to FIG. 11, because the second end portion of the first substrate SUB1 is delaminated from the second substrate SUB2, a gap "Gap" may be formed between the top surface of the second end portion of the first substrate SUB1 and the bottom surface of the second end portion of the second substrate SUB2. The second end portion of the first substrate SUB1 where the gap "Gap" is formed may be separated or removed from the rest of the first substrate SUB1. In one example, the second end portion of the first substrate SUB1 may be separated from the rest of the first substrate SUB1 via laser scribing, mechanical scribing, and grinding, but the present disclosure is not limited thereto.

Figure 12:
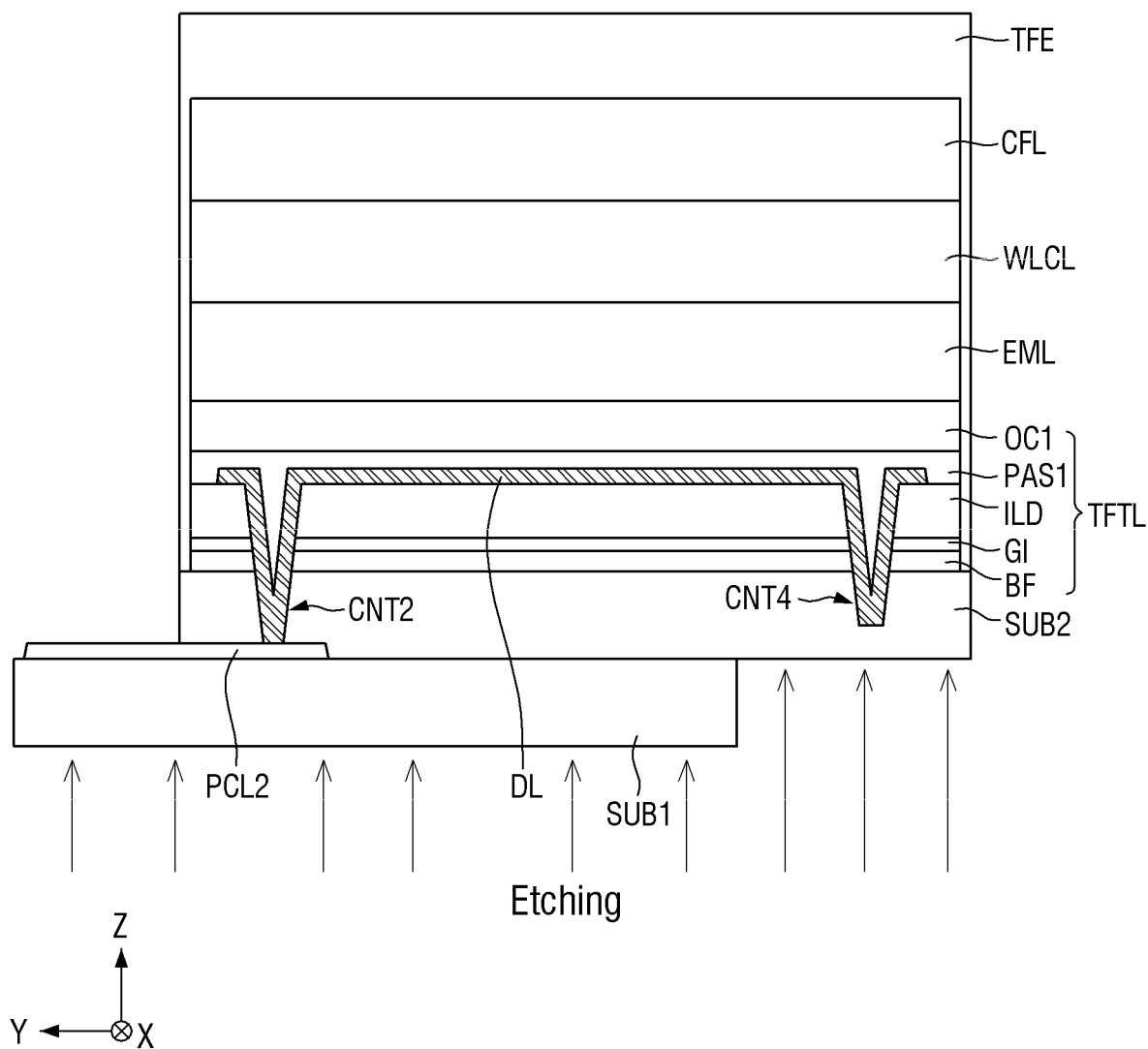

Referring to FIG. 12, because the second end portion of the first substrate SUB1 is removed, the first substrate SUB1 may be recessed from the second end portion of the second substrate SUB2 in the second direction (e.g., the Y-axis direction) so that the bottom surface of the second end portion of the second substrate SUB2 is exposed.

The exposed bottom surface of the second end portion of the second substrate SUB2 may be etched. In one example, the entire bottom surface of the first display device 10-1 may be dry-etched by being exposed to an etching gas. Here, the etching gas may include a material that can etch the second substrate SUB2 but cannot etch the first substrate SUB1. Thus, the first substrate SUB1 may act as a mask during the dry-etching of the first display device 10-1.

Figure 13:
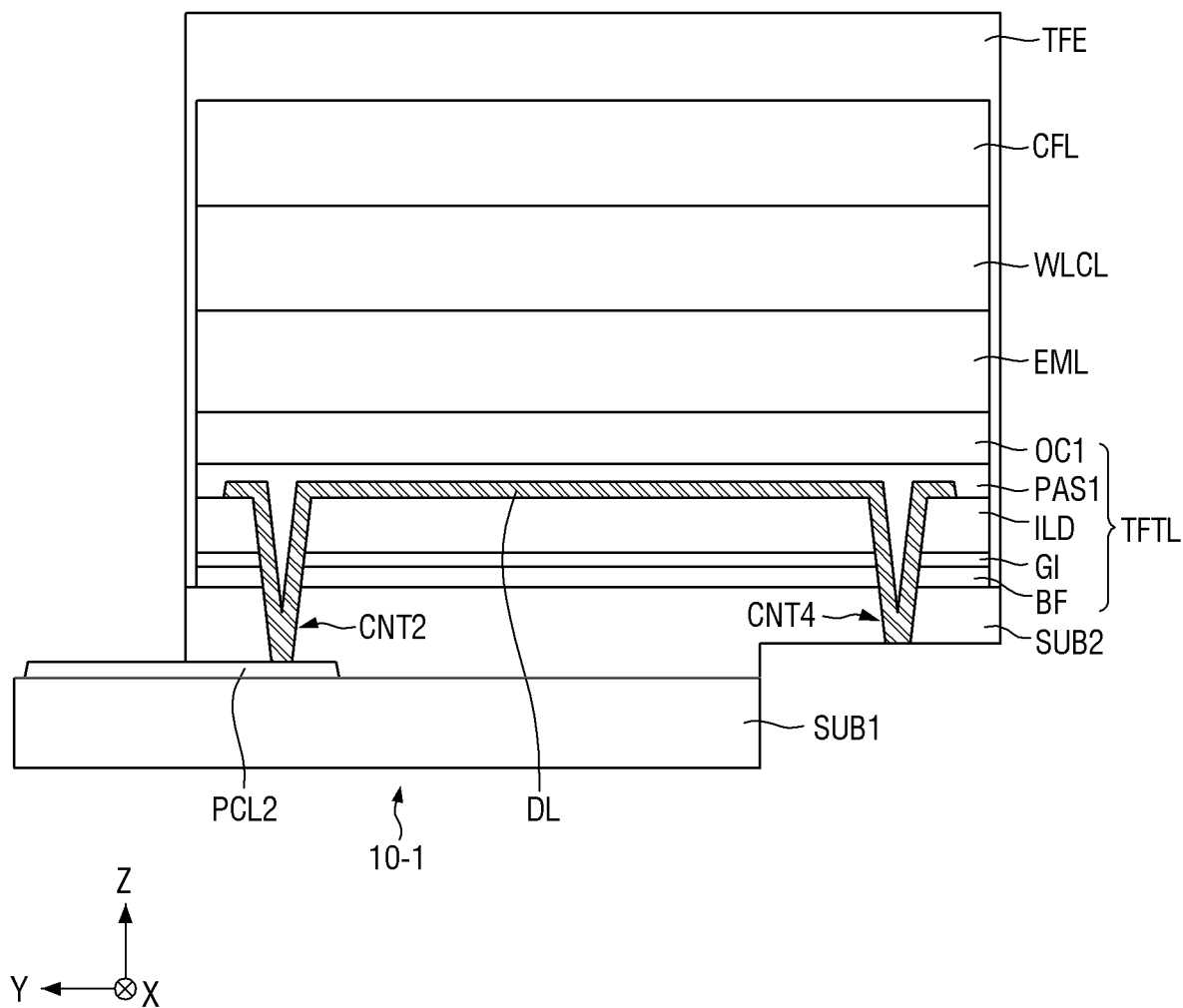

Referring to FIG. 13, because the bottom surface of the second end portion of the second substrate SUB2 is etched, the data line DL in the fourth contact opening CNT4 may be exposed.

The thickness of the first end portion of the second substrate SUB2, which is supported by (e.g., overlaps) the first substrate SUB1, may be greater than the thickness of the second end portion of the second substrate SUB2, which is not supported by (e.g., is exposed by) the first substrate SUB1.

Figure 14:
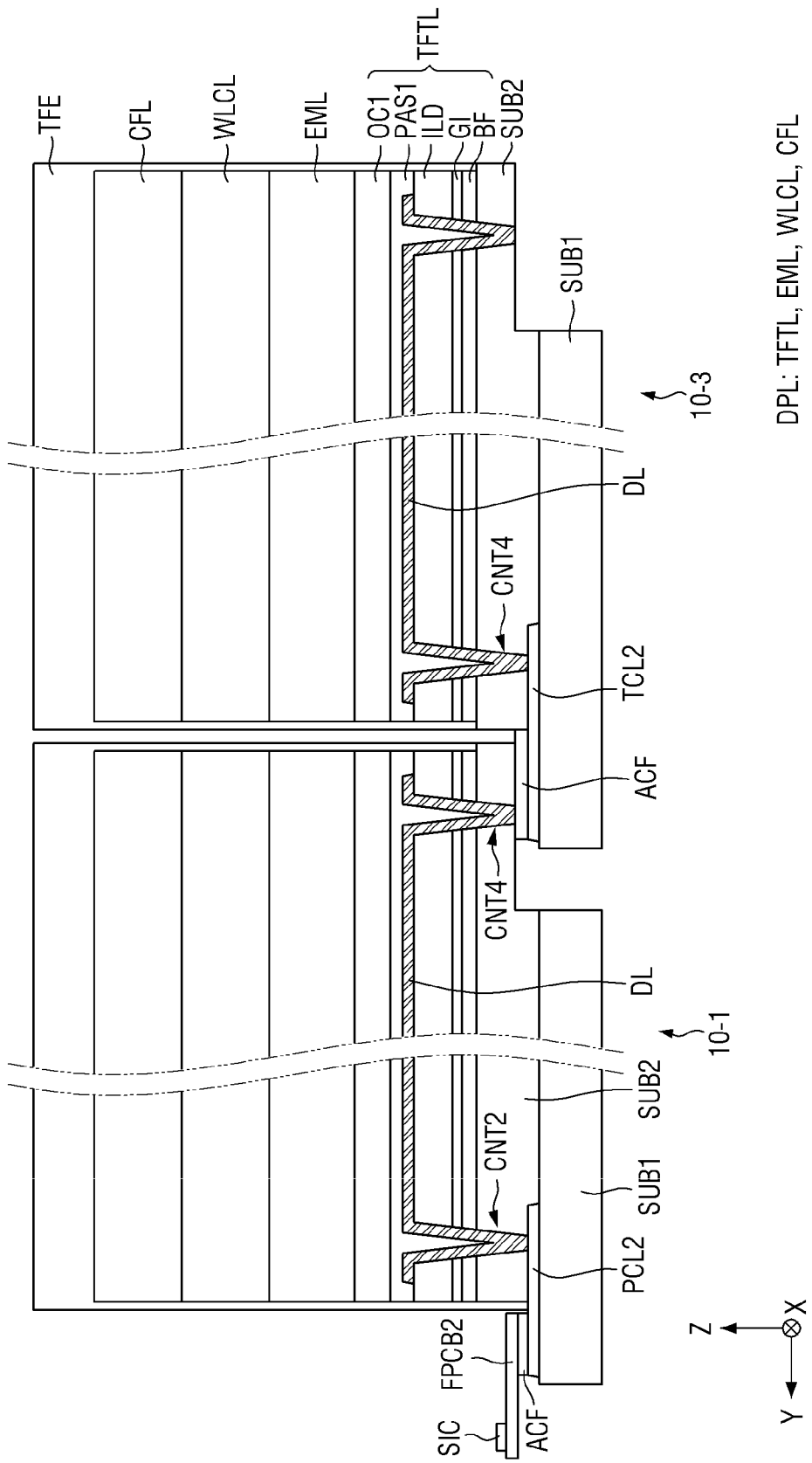

Referring to FIG. 14, the first and third display devices 10-1 and 10-3 may be coupled together.

A second end portion of the first substrate SUB1 that faces the first substrate SUB1 of the third display device 10-3 may be recessed from the second end portion of the second substrate SUB2 of the first display device 10-1 in the second direction (e.g., the Y-axis direction). A first end portion of the first substrate SUB1 of the third display device 10-3 may be projected from a first end portion of the second substrate SUB2 of the third display device 10-3 in the second direction (e.g., the Y-axis direction). Thus, when the first and third display devices 10-1 and 10-3 are coupled to each other, the first end portion of the first substrate SUB1 of the third display device 10-3 may be inserted in the recessed second end portion of the first substrate SUB1 of the first display device 10-1. An edge portion of the first substrate SUB1 of the third display device 10-3 may overlap the second substrate SUB2 of the first display device 10-1 in the thickness direction (e.g., the Z-axis direction).

The tiled display device TD may further include a connection film ACF. The connection film ACF may be disposed between the data line DL of the first display device 10-1, which extends into the fourth contact opening CNT4 in the first display device 10-1, and the second connection line TCL2 to electrically connect the data line DL of the first display device 10-1 and the second connection line TCL2.

The second connection line TCL2 may be disposed on an edge portion of the first substrate SUB1 of the third display device 10-3. A first end portion of the second connection line TCL2 may overlap the second substrate SUB2 of the first display device 10-1 in the thickness direction (e.g., the Z-axis direction), and a second end portion of the second connection line TCL2 may be covered by the second substrate SUB2 of the third display device 10-3. In one example, the second end portion of the second connection line TCL2 may be disposed in the display area DA of the third display device 10-3, and the first end portion of the second connection line TCL2 may extend into the display area DA of the first display device 10-1. The first end portion of the second connection line TCL2 may be connected to the data line DL of the first display device 10-1 via the connection film ACF, and the second end portion of the second connection line TCL2 may be connected to the data line DL of the third display device 10-3.

Thus, the second connection line TCL2 may connect the data lines DL of the first and third display devices 10-1 and 10-3 to each other. A source driver SIC disposed on the upper side of the first display device 10-1 may provide a data voltage to the data line DL of the first display device 10-1. The data line DL of the first display device 10-1 may extend from the upper side to the lower side of the display area DA of the first display device 10-1 and may extend into the fourth contact opening CNT4 in the first display device 10-1. The data voltage from the data line DL of the first display device 10-1 may be provided to the data line DL of the third display device 10-3 via the connection film ACF and the second connection line TCL2.

Some of the display devices 10 of the tiled display device TD may include source drivers SIC, and the other display devices 10 of the tiled display device TD may not include source drivers SIC. In one example, the first display device 10-1, which includes source drivers SIC, may provide data voltages to the third display device 10-3, which does not include any source drivers SIC, via the second connection line TCL2. Thus, the bonding area SM between the first and third display devices 10-1 and 10-3 may not include any source drivers SIC, and the distance between the first and third display devices 10-1 and 10-3 may be so small that the bonding area SM may become almost invisible to the user.

Because the first end portion of the second connection line TCL2 extends into the display area DA of the first display device 10-1 and is placed below the second substrate SUB2 of the first display device 10-1, the distance between the first and third display devices 10-1 and 10-3 can be reduced or minimized. Thus, because the second connection line TCL2, which connects the data lines DL of the first and third display devices 10-1 and 10-3 to each other, is provided, no second flexible films FPCB2 and no source drivers SIC may be provided in the bonding area SM between the first and third display devices 10-1 and 10-3.

The tiled display device TD may not include any second flexible films FPCB2 or any source drivers SIC in the bonding areas SM between the display devices 10 of the tiled display device TD, and the distance between the display devices 10 of the tiled display device TD may be so small that the bonding areas SM between the display devices 10 of the tiled display device TD may be almost invisible to the user. The reflectance of the display areas DA of the display devices 10 of the tiled display device TD for external light may be substantially the same as the reflectance of the bonding areas SM between the display devices 10 of the tiled display device TD for external light. Thus, the bonding areas SM between the display devices 10 of the tiled display device TD may not be visible or readily visible to the user. Accordingly, a sense of discontinuity between the display devices 10 of the tiled display device TD can be reduced or eliminated, and the degree of immersion of an image can be improved.

What is claimed is:

1. A display device comprising:
   a first substrate;
   a second substrate on the first substrate and exposing a first edge portion of the first substrate, the second substrate protruding beyond a second edge portion of the first substrate;
   a connection line on the first edge portion of the first substrate, the connection line having a first end portion protruding beyond a first side of the second substrate and a second end portion covered by the second substrate; and
   a thin-film transistor layer on the second substrate and connected to the connection line, the thin-film transistor layer comprising signal lines extending from the first side to a second side of the second substrate,
   wherein the signal lines extend into contact openings in the thin-film transistor layer and are exposed at a lower part of the second substrate on the second side of the second substrate.

2. The display device of claim 1, wherein the signal lines comprise a gate line configured to provide a gate signal to the thin-film transistor layer,
   wherein a first end portion of the gate line is in a first contact opening, the first contact opening penetrating the thin-film transistor layer and the second substrate on the first side of the second substrate to be connected to the connection line, and
   wherein a second end portion of the gate line is in a second contact opening, the second contact opening penetrating the thin-film transistor layer and the second substrate on the second side of the second substrate to be exposed at the lower part of the second substrate on the second side of the second substrate.

3. The display device of claim 1, wherein the signal lines comprise a data line configured to provide a data voltage to the thin-film transistor layer,
   wherein a first end portion of the data line is in a third contact opening, the third contact opening penetrating the thin-film transistor layer and the second substrate on the first side of the second substrate to be connected to the connection line, and
   wherein a second end portion of the data line is in a fourth contact opening, the fourth contact opening penetrating the thin-film transistor layer and the second substrate on the second side of the second substrate to be exposed at the lower part of the second substrate on the second side of the second substrate.

4. The display device of claim 1, further comprising:
a connection film on an end portion of the connection line; and
a flexible film on the connection film.

* * * * *